United States Patent
Cola et al.

(10) Patent No.: US 10,985,313 B2
(45) Date of Patent: Apr. 20, 2021

(54) MULTILAYER COATINGS FORMED ON ALIGNED ARRAYS OF CARBON NANOTUBES

(71) Applicant: Georgia Tech Research Corporation, Atlanta, GA (US)

(72) Inventors: Baratunde Cola, Atlanta, GA (US); Asha Sharma, Atlanta, GA (US); Virendra Singh, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 16/738,894

(22) Filed: Jan. 9, 2020

(65) Prior Publication Data
US 2020/0227631 A1    Jul. 16, 2020

Related U.S. Application Data

(62) Division of application No. 14/434,118, filed as application No. PCT/US2013/065918 on Oct. 21, 2013, now Pat. No. 10,541,363.
(Continued)

(51) Int. Cl.
*H01L 51/05* (2006.01)
*H01L 45/00* (2006.01)
(Continued)

(52) U.S. Cl.
CPC .............. *H01L 45/00* (2013.01); *B82Y 10/00* (2013.01); *H01L 31/02167* (2013.01);
(Continued)

(58) Field of Classification Search
CPC . H01L 51/05; H01L 51/0587; H01L 51/0048; H01L 31/035227; H01L 31/062;
(Continued)

(56) References Cited

U.S. PATENT DOCUMENTS

| 2003/0100189 A1 | 5/2003 | Lee |
| 2005/0167655 A1 | 8/2005 | Furukawa |
| (Continued) | | |

FOREIGN PATENT DOCUMENTS

| JP | 2006150542 | 6/2006 |
| JP | 2007007814 | 1/2007 |
| WO | 2006031981 | 3/2006 |

OTHER PUBLICATIONS

Chen, et al., "Externally Assembled Gate-All-Around Carbon Nanotube Field-Effect Transistor", IEEE Electron Device Letters, 29(2) (2008).

*Primary Examiner* — Edward J. Schmiedel
(74) *Attorney, Agent, or Firm* — Pabst Patent Group LLP

(57) ABSTRACT

Arrays containing carbon nanostructure-oxide-metal diodes, such as carbon nanotube (CNT)-oxide-metal diodes and methods of making and using thereof are described herein. In some embodiments, the arrays contain vertically aligned carbon nanostructures, such as multiwall carbon nanotubes (MWCNTs) coated with a conformal coating of a dielectric layer, such as a metal oxide. The tips of the carbon nanostructures are coated with a low work function metal, such as a calcium or aluminum to form a nanostructure-oxide-metal interface at the tips. The arrays can be used as rectenna at frequencies up to about 40 petahertz because of their intrinsically low capacitance. The arrays described herein produce high asymmetry and non-linearity at low turn on voltages down to 0.3 V and large current densities up to about 7,800 mA/cm² and a rectification ratio of at least about 10, 15, 20, 25, 30, 35, 40, 45, 50, 55, or 60.

17 Claims, 19 Drawing Sheets

Related U.S. Application Data

(60) Provisional application No. 61/716,101, filed on Oct. 19, 2012.

(51) Int. Cl.
| | | |
|---|---|---|
| *H01L 51/00* | (2006.01) |
| *B82Y 10/00* | (2011.01) |
| *H01L 31/0224* | (2006.01) |
| *H01L 31/0216* | (2014.01) |
| *H01L 31/0352* | (2006.01) |
| *H01L 51/42* | (2006.01) |
| *H01L 31/0392* | (2006.01) |
| *H01L 31/108* | (2006.01) |

(52) U.S. Cl.
CPC .. *H01L 31/022425* (2013.01); *H01L 31/0392* (2013.01); *H01L 31/035227* (2013.01); *H01L 31/108* (2013.01); *H01L 51/0048* (2013.01); *H01L 51/0579* (2013.01); *H01L 51/4206* (2013.01); *H01L 51/0587* (2013.01); *Y02E 10/549* (2013.01)

(58) Field of Classification Search
CPC ..... H01L 31/061; H01L 31/07; H01L 31/113; H01L 31/1133; H01L 31/1136
See application file for complete search history.

(56) References Cited

U.S. PATENT DOCUMENTS

| | | |
|---|---|---|
| 2006/0207647 A1 | 9/2006 | Tsakalakos |
| 2007/0240757 A1 | 10/2007 | Ren |
| 2008/0191189 A1 | 8/2008 | Kastalsky |
| 2008/0251723 A1 | 10/2008 | Ward |
| 2008/0296551 A1 | 12/2008 | Nihei |
| 2009/0189143 A1 | 7/2009 | Kastalsky |
| 2009/0308443 A1 | 12/2009 | Cutler |
| 2010/0133513 A1 | 6/2010 | Schmidt |
| 2010/0232012 A1 | 9/2010 | Crowley |
| 2010/0236502 A1 | 9/2010 | Watanabe |
| 2010/0244656 A1 | 9/2010 | Ito |
| 2011/0163920 A1 | 7/2011 | Cutler |
| 2011/0308564 A1 | 12/2011 | Kempa |
| 2012/0236502 A1 | 9/2012 | Yamaguchi |

DIFFERENT DEVICES

MULTILAYER COATINGS FORMED ON ALIGNED ARRAYS OF CARBON NANOTUBES

CROSS-REFERENCE TO RELATED APPLICATIONS

This application is a continuation of U.S. application Ser. No. 14/434,118, filed Apr. 8, 2015, which is a National Phase application under 35 U.S.C. § 371 of International Application No. PCT/US2013/065918, filed Oct. 21, 2013, which claims the benefit of and priority to U.S. Provisional Application No. 61/716,101, filed Oct. 19, 2012, all of which are incorporated herein by reference in their entirety.

FIELD OF THE INVENTION

This invention is generally in the field of diode arrays, particularly carbon nanostructure-oxide-metal diode arrays.

BACKGROUND OF THE INVENTION

Infrared (IR) detectors that operate at room temperature with lightweight and inexpensive materials hold unlimited potential in the military, security, and medical fields. Enhanced target acquisition, surveillance, night vision, etc. are some of the benefits that such IR detectors could provide for military and security applications.

Antennas coupled to rectifying diodes, or rectenna, are currently of research interest for their use in IR detection and solar energy conversion. Metal-insulator-metal (MIM) tunnel diodes have been investigated for use over large areas and for coupling the diodes to dipole antenna array in planar geometries. The theoretical and manufacturing aspects of square spiral nanoscale rectenna elements as electromagnetic collectors fabricated on plastic sheets has recently been explored. In another approach, transfer printing techniques that use plasma oxidized $AlO_x$ thin dielectrics were explored as a method to enable large area manufacturing of MIM diodes.

Although the concept of IR an optical rectenna was first introduced in the 1970s and was validated with limited efficiency for collection and conversion of mid IR ($CO_2$ laser), no practical demonstration of rectification at IR or visible or solar wavelengths using rectenna has been reported. Major technical challenges include fabricating the small diode geometries required to enable operation by quantum mechanical tunneling at THz frequencies over large areas.

The emergence of nanomaterials offers significant promise in overcoming the limitations on rectenna mentioned above. In particular, CNTs have been shown to provide exceptional functional performance in nanoelectronics and sensing applications. However, numerous challenges remain both in the fundamental understanding of their transport physics and in achieving scalable and robust manufacturing methods for integrated devices.

Recently, random arrays of aligned multiwall CNTs have been shown to demonstrate antenna-like interactions with electromagnetic radiation. The multiwall CNTs exhibited both polarization and the length antenna effects that could be used in rectennas for IR and optical detection and solar harvesting applications. However, as discussed above, the ability to extract this energy efficiently through appropriate diodes remains a challenge.

There exists a need for nanostructure-based diodes that exhibit improved energy collection and conversion.

Therefore, it is an object of the invention to provide nanostructure-based diodes that exhibit improved energy collection and conversion and methods of making and using thereof.

SUMMARY OF THE INVENTION

Arrays containing carbon nanostructure-oxide-metal diodes, such as carbon nanotube (CNT)-oxide-metal diodes, and methods of making and using thereof are described herein. Suitable nanostructures include, but are not limited to, carbon nanofibers, horns, cones, tubes, or any other high aspect ratio graphitic nanocarbon. In some embodiments, the arrays contain vertically aligned carbon nanotubes, such as multiwall carbon nanotubes (MWCNTs). The nanostructures are coated with a conformal coating of a dielectric layer, such as a metal oxide. The tips of the carbon nanostructures are coated with a low or high work function metal to form a carbon nanostructure-oxide-metal interface at the tips.

The arrays can be used as rectenna at frequencies up to about 40 petahertz because of their intrinsically low capacitance. The arrays described herein produce high asymmetry and non-linearity at low turn on voltages down to 0.3 V and large current densities up to about 7,800 $mA/cm^2$ and a rectification ratio of at least about 10, 15, 20, 25, 30, 35, 40, 45, 50, 55, or 60. In some embodiments, the arrays, with heights from 10 to 20 micrometers, produce open circuit voltage on the order of 1 mV or greater when illuminated by laser wavelengths of 1064 nm or 532 nm, or when illuminated by AM1.5 0.01 $W/cm^2$ solar light. In some embodiments, the arrays produce short circuit current densities greater than 0.1 $\mu A/cm^2$ or 1 $\mu A/cm^2$ when illuminated by laser wavelengths of 1064 nm or 532 nm, or when illuminated by AM1.5 0.01 $W/cm^2$ solar light.

The devices herein exhibit rectification ratios, current density, and energy conversion efficiency changes less than 2, 1.5, 1.0, or 0.5% at a temperature range of 5° C. to 77° C. The devices herein exhibit rectification ratios, current density, and energy conversion efficiency changes less than 10, 9, 8, 7, 6, 5, 4, 3, or 2% at a temperature range of 5° C. to 400° C. or a temperature range from 2K to 300K.

BRIEF DESCRIPTION OF THE DRAWINGS

FIG. 3b is a semi-logarithmic plot of the current density (mA/cm2) as a function of voltage (V) for the devices referenced in FIG. 3a.

FIG. 7b is a graph showing J(mA/cm$^2$) as a function of voltage (V) for the MWCNT-O-M diode arrays with different oxide thicknesses specified in FIG. 7a.

FIG. 13B shows the zero bias current response and FIG. 13C shows the open circuit voltage response.

DETAILED DESCRIPTION OF THE INVENTION

I. Definitions

Figure 1:
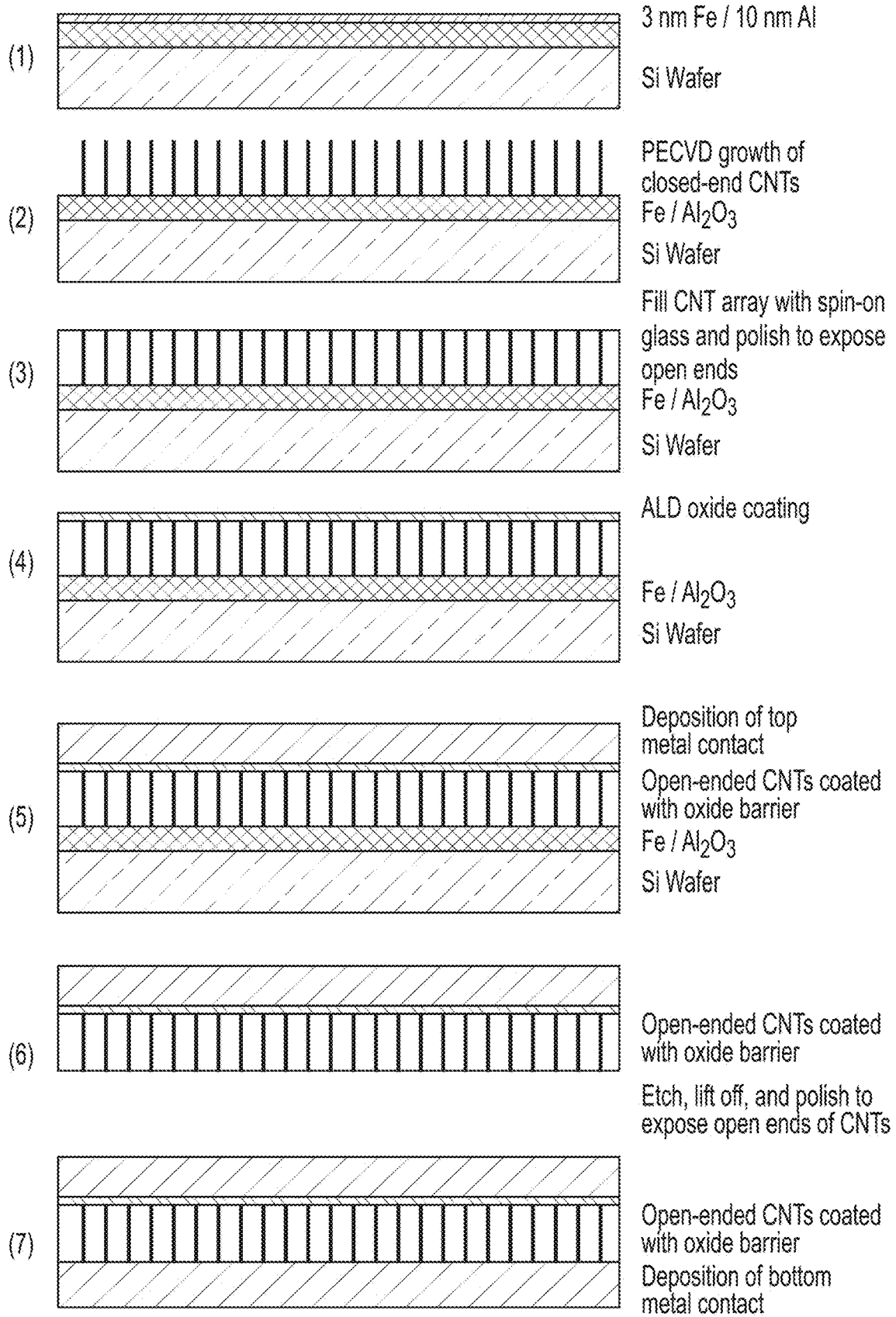
FIG. 1 is a process flow diagram of CNT rectenna fabrication. Step (1) is a silicon wafer substrate coated with a catalytic layer of Fe and Al for nanotube growth. Step (2) shows the plasma-etched chemical vapor deposition growth of closed-end carbon nanotubes from the catalytic layer. Step (3) shows a CNT array with open-ended nanotubes. Step (4) shows the introduction of the dielectric layer. Step (5) shows deposition of the metal contacts. Step (6) shows removal of the open-ended CNTs coated with the dielectric layer and metal contacts from the substrate to open the bottom ends of the nanotubes. Step (7) shows deposition of the bottom metal contact.

"Substrate" or "support", as used herein, refers to the material on which the nanotubes are grown. A variety of materials can serve as a support for multilayer substrates. Generally, the support is inert, meaning that the support does not chemically participate in the formation of nanotubes on the multilayer substrate. In some embodiment, the support is formed at least in part from a metal including, but not limited to, aluminum, cobalt, chromium, zinc, tantalum, platinum, gold, nickel, iron, tin, lead, silver, titanium, indium, copper, or combinations thereof and/or one or more metal oxides, such as oxides of the metals listed above. Other materials include, but are not limited to, ceramics and silicon or silicon compounds, such as silicon dioxide. In some embodiments, the surface of the support may be treated to increase adhesion with the adhesion layer. Such treatment may include, but are not limited to, the use of plasma-assisted or chemical-based surface cleaning. Another treatment includes the deposition of a metal or metal oxide coating or particles on the support. In some embodiments, the surface of the support may be treated to reduce adhesion with the carbon nanotube array. Such treatments include, but are not limited to, the use of water vapor during nanotube growth or a support layer that can be chemically removed to liberate nanotubes from the support.

"Support layer", as used herein, typically refers to a metal layer added to the substrate between the substrate and the multilayers and CNTs to improve its electrical conductivity.

"Adhesion layer", as used herein, generally refers to material that improves the adhesion of the interface layer to the support. Generally, the adhesion layer must be thick enough to remain a continuous film at the elevated temperatures used to form CNTs. The adhesion layer also generally provides resistance to oxide and carbide formation during CNT synthesis at elevated temperatures.

"Interface layer", as used herein, generally refers to material, usually a metal, which is oxidized under conditions of nanotube synthesis or during exposure to air after nanotube synthesis to form a suitable metal oxide. Generally, the interface layer is thin enough to allow the catalytic layer and the adhesion layer to diffuse across it. In some embodiments wherein the catalytic layer and the adhesion layer have the same composition, this reduces migration of the catalyst into the interface layer, improving the lifetime of the catalyst during nanotube growth. In other embodiments, the interface layer is used without an adhesion layer to facilitate removal of nanotubes from the substrate.

"Catalyst layer" or "catalytic layer", as used herein, refers to a material or materials that is (are) resistant to oxidation and/or carbide formation under the chemical vapor deposition conditions used to form CNT arrays. The catalytic can be a thin film formed from a transition metal that can catalyze the formation of carbon nanotubes via chemical vapor deposition. Examples of suitable materials that can be used to form the catalytic layer include iron, nickel, cobalt, rhodium, palladium, and combinations thereof. The catalytic layer is of appropriate thickness to form catalytic nanoparticles or aggregates under the annealing conditions used during nanotube formation.

"Carbon Nanotube Array" or "CNT array" or "CNT forest", as used herein, refers to a plurality of carbon nanotubes which are vertically aligned on a surface of a material. Carbon nanotubes are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

"Dielectric layer", as used herein, means a conformal coating, generally a metal oxide or combination of metal oxide multilayers, formed on the nanotubes. In some embodiments this layer is applied only to nanotube tips that are opened by polishing the support layer. In some embodiments, the dielectric layer is a polymer or molecules or electrolyte.

"Low work function material", as used herein, refers to a material, such as a metal, having a work function of at least 0.5, 1, 1.5, 2, 2.5, or 3 eV lower than the work function of the carbon nanotubes.

"High work function material", as used herein, refers to a material, such as a metal, having a work function of at least 0.5, 1, 1.5, 2, 2.5, or 3 eV higher than the work function of the carbon nanotubes.

"High asymmetry", as used herein, means that if the current at positive applied voltages increases with increased voltage then the current at negative applied voltages changes by less than about 10, 9, 8, 7, 6, or 5% of the change in current at positive voltages over the same absolute value of voltage range. Or that if the current at negative applied voltages increases with increased negative voltage then the current at positive applied voltages changes by less than about 10, 9, 8, 7, 6, or 5% of the change in current at negative voltages over the same absolute value of voltage range. In some embodiments, high asymmetry is synonymous with a rectification ratio of at least about 10, 15, 20, 25, 30, 35, 40, 45, 50, 55, or 60

"Non-linearity", as used herein, means the rate at which current increases when voltage increases, goes up with voltage as well.

"Turn on voltage", as used herein, means the voltage at which a line fit to the linear portion of the current-voltage curve intercepts the y-axis (i.e., zero current).

"Cut off frequency", as used herein, means the frequency at which the efficiency of the CNT-oxide-metal diode or rectenna begins to decrease rapidly to zero. When the diode resistance is much greater than the antenna resistance, the cutoff frequency for rectenna is defined as $$f_c = \frac{1}{2\pi \cdot R_A \cdot C_D}$$

where $R_A$ is the antenna resistance and $C_D$ is the capacitance of the rectenna diode "Rectenna", as used herein, refers to a device containing an antenna coupled to rectifying diodes. A rectenna can be used for broadband electromagnetic wave energy conversion including IR detection and solar energy conversion. Rectenna convert alternating current (AC) solar electromagnetic waves into direct current (DC) power by receiving them in an antenna and rectifying the current in a diode.

"Rectification", as used herein, means the conversion of alternating current (AC) to direct current (DC).

"Rectification ratio", as used herein, means the ratio of the forward current to the reverse current at a certain applied voltage.

"Conformal" as used herein means covering the surface topography completely with no pin holes or defects to expose the underlying material.

II. Carbon Nanostructure (CNS) Diode Arrays

Arrays containing carbon nanostructure-oxide-metal diodes, such as carbon nanotube (CNT)-oxide-metal diodes, and methods of making and using thereof are described herein. Suitable nanostructures include, but are not limited to, carbon nanofibers, horns, cones, tubes, or any other high aspect ratio graphitic nanocarbon. In some embodiments, the arrays contain vertically aligned carbon nanotubes, such as multiwall carbon nanotubes (MWCNTs). The nanostructures are coated with a conformal coating of a dielectric layer, such as a metal oxide. The tips of the carbon nanostructures are coated with a low or high work function metal to form a carbon nanostructure-oxide-metal interface at the tips. The arrays provide a much higher packing density than a planar geometry resulting in improved electrical performance as discussed below. In some embodiments, the density of the nanostructure, such as tubes, is from about $10^8$ to $10^{12}$ CNTs/cm². In some embodiments, the density is about $10^{10}$ CNTs/cm².

A. Carbon Nanotubes (CNTs)

In some embodiments, the arrays contain nanotubes which are continuous from the top of the array (i.e., the surface formed by the distal end of the carbon nanotubes when vertically aligned on the substrate) to bottom of the array (i.e., the surface of the substrate).

The array may be formed from multi-wall carbon nanotubes (MWNTs), which generally refers to nanotubes having between approximately 4 and approximately 10 walls, preferably from about 6 to about 10 walls, more preferably from about 8 to about 10 walls, most preferably about 10 walls. The array may also be formed from metallic few-wall nanotubes (FWNTs), which generally refers to nanotubes containing approximately 1-3 walls. FWNTs include single-wall carbon nanotubes (SWNTs), double-wall carbon nanotubes (DWNTS), and triple-wall carbon nanotubes (TWNTs). The array may also be formed from carbon nanofibers, horns, cones, or any other high aspect ratio graphitic nanocarbon structure.

In certain embodiments, the nanotubes are MWNTs. In some embodiments, the diameter of MWNTs in the arrays ranges from 5 to 40 nm, preferably 5 to 20 nm, more preferably 5-10 nm, most preferably from about 7 to about 8 nm. The diameter of the nanotube defines the active area of electrical activity. The cut-off frequency is inversely proportional to the square of the diameter of the nanotubes. When the diode resistance is much greater than the antenna resistance, the cutoff frequency for rectenna is defined as $$f_c = \frac{1}{2\pi} \sim R_A \sim C_D$$

where $R_A$ is the antenna resistance and $C_D$ is the capacitance of the rectenna diode. The capacitance of the diode is proportional to the diode area.

The arrays provide a much higher packing density than a planar geometry resulting in improved electrical performance as discussed below. In some embodiments, the density of the nanostructure, such as tubes, is from about $10^8$ to $10^{12}$ CNTs/cm². In some embodiments, the density is about $10^{10}$ CNTs/cm².

The length (height) of MWNTs in the arrays can range from about 0.5 microns to about 50 microns, preferably the length of the MWNTs is matched to the wavelength of the electromagnetic energy that is coupled to the rectenna device or MWNT antenna component of the rectenna device. For example 0.5 micron length would be most preferred as a detector for light at 500 nm wavelength, and 10 micron length would be most preferred as a detector for infrared energy at 10 micron wavelength. Other suitable wavelengths include 300 to 2500 nm (wavelengths in the solar spectrum), 1,100 to 2,500 nm (for "catching" applications where the device is placed behind a solar cell to "catch" the solar energy that silicon cannot absorb), 740 to 1,000 nm (tele-communications applications), 1,000 to 3,000 nm (remote sensing), 3,000 to 5,000 nm (high temperature inspection), 8,000 to 14,000 nm (ambient temperature inspection), and 14,000 to 50,000 nm (spectrometry and astronomy applications).

For broadband solar absorption, the length of the MWNTs is preferably 1, 2, 3, or 4 times the maximum solar wavelength, more preferably 2, 3, or 4 times the maximum solar wavelength, most preferably 4 times the maximum solar wavelength.

The carbon nanotubes can be manipulated to make electric contact to the inner walls of the carbon nanotubes in the diode junctions. It is suggested that the series resistance of a single CNT diode junction is at least 20 GΩ, which is about eight orders of magnitude higher than what has been achieved for ohmic contacts to open-ended multiwall CNTs. Nanofabrication techniques can be employed to open the ends of CNTs in the diode junctions to facilitate low resistance contacts and conduction through multiple multiwall CNT shells to quantify and understand the achievable lower limit to single junction series resistance. For example, spin-on glass can be used to infiltrate the CNT array and polishing the glass to expose open ends of the CNTs. This allows the diode junction to be formed with contact made to the inner walls of the multiwall CNTs and increases the active conduction channels. Chemical treatment in vapor or solution phase can also be used to open one or both ends of the multiwall CNTs to form low resistance contacts. Other etching processing including plasma or ion etching can be used to open one or both ends of the multiwall CNTs to form low resistance contacts. The metal contacts and/or the dielectric layer can contact multiple nanostructure walls or surfaces.

In embodiments where an adhesion-promoting layer is not used, the absence of this layer facilitates etching of the catalyst particles and lift off of the glass-CNT layer from the substrate. Once removed from the growth substrate, the bottom of the CNT array in glass can be polished and or etched to expose open ends of the CNTs. This allows the bottom metal to be deposited to be in contact with multiple CNTs walls. The thickness of the top and bottom metal layers can be controlled as necessary to allow sufficient optical transparency for rectenna testing. Also, metals with high (e.g., Au) and low (e.g., Al or Ca) work function and work functions can be chosen to optimize the barrier heights with the oxide dielectric layer.

The electronic structure of the nanotubes can also be manipulated by introducing donor or acceptor levels (e.g., Nitrogen or Boron) through doping. Such dopants can introduce acceptor like or donor like states very close to the Fermi level (within 0.5 eV) of the CNTs because of the formation of nanodomains in the lattice. Nitrogen doping can be accomplished in-situ by adjusting the concentration of nitrogen in the chamber during CNT growth. Boron doping can be accomplished in a different plasma chamber after CNT growth.

B. Dielectric Layer

The carbon nanotubes are coated with a conformal coating of a dielectric layer. Exemplary materials include, but are not limited to, metal or metalloid oxides, such as $Al_2O_3$, $AlO_x$, $ZrO_2$, $TiO_2$, $ZnO$, $SiO_2$, $MgO$, $Nb_2O_5$, $CoO$, $NiO$, $Ta_2O_5$, and $HfO_2$, polymeric dielectrics, organic surface modifiers or molecules, ionic liquids, and combinations thereof. In some embodiments, the dielectric layer is a metal oxide or metalloid oxide, such as $Al_2O_3$, $ZrP_2$, and $TiO_2$ with different electron affinities, 1.0, 2.5 and 3.9 eV, respectively. Bringing the electron affinity of the insulator close to the value of one of the electrode work functions is one possible way to lower the barrier height in the tunnel diodes. In particular embodiments, the dielectric layer is alumina. In some embodiments, the carbon nanotubes can be functionalized with one or more reactive functional groups to allow for conformal coating of the nanotubes.

The electron density of the dielectric layer can be reversibly or irreversible altered by doping the dielectric layer. Suitable dopants include, but are not limited to, nitrogen, boron, oxygen, hydrogen, and hydroxyls.

The thickness of the coating can be varied. Experimental data suggests that the thickness of the oxide insulator layer affects the barrier height and consequently correlates to the turn on voltage and tunneling current. With improved fabrication procedures such as CNT functionalization to improve oxide nucleation density, the lower limit of insulator thickness and fundamental limits on diode operation by quantum mechanical tunneling can be further explored. In some embodiments, the thickness of the dielectric layer is from about 0.5 to about 15 nm, preferably from about 8 to about 1 nm, more preferably from about 5 to about 1 nm, most preferably from about 4 to about 2 nm.

C. Metal Contacts

Thl le tips or ends of the carbon nanotubes are coated with a metal to form low-resistance metal contacts. One end or both ends can be coated with a metal. In some embodiments, both ends are coated. The metal can be a low work function metal or a high work function metal. Exemplary low work function metals include, but are not limited to, Al, Ca, Mg:Ag, LiF:Al, Ti, In, Ta, Hf, Zr, and combinations thereof. In some embodiments, the low work function metal is aluminum or calcium.

Exemplary high work function metals include, but are not limited to, Pt, Au, W, Co, Ni, Pd, Ir, and Os. In some embodiments, the metal is Pt or Au. Other high work function materials that can be used to coat the contacts include metal oxides including, but not limited to, indium tin oxide, and electrically conducting polymers including, but not limited to, aromatic and non-aromatic conjugated polymer, such as poly(3,4-3thylenedioxythiophene) poly(styrenesulfonate) (PEDOT:PSS), poly(3,4-3thylenedioxythiophene) (PEDOT), polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene), polyacetylenes, and polydiacetylenes. The polymer classes listed above include substituted polymers, wherein the polymer backbone is substituted with one or more functional groups, such as alkyl groups.

The coated tips act as point contacts which can enhance the local electric field resulting in local enhancement of the current. The diode arrays described herein exhibit a rectification of at least about 10, 15, 20, 25, 30, 35, 40, 45, 50, 55, or 60.

III. Methods of Making CNT Rectennas

A. CNT Arrays

The CNTs can be grown on the substrate using any technique known in the art. In some embodiments, the CNTs are grown on the substrate using low-pressure chemical vapor deposition (LPCVD). Using catalyst engineering and processing during vapor deposition, the diameter, height, and alignment of the nanotubes can be controlled. Techniques such as plasma-enhanced chemical vapor deposition (PECVD) can be used to promote greater alignment in the CNT arrays, which can improve rectification in the CNT-O-M diodes.

The substrate can be annealed before CNT growth if necessary. The substrate is generally annealed for a short period of time, for example for approximately ten minutes. Typically, the multilayer substrate is annealed under flow of an inert gas, such as nitrogen or argon. In certain embodiments, the annealing temperature is between about 500° C. and about 650° C., more preferably between about 500° C. and about 600° C., most preferably between about 525° C. and about 575° C.

Any suitable carbon source gas may be used. In some embodiments, the carbon source gas is acetylene. Other suitable carbon source gases include ethene, ethylene, methane, n-hexane, alcohols, xylenes, metal catalyst gases (e.g., carbonyl iron), and combinations thereof. In some embodiments, the source gas is a metal catalyst gas, which can be used with or without the catalyst layer.

The substrate can be coated with support and catalyst layers for CNT growth. The support layer can be formed from a variety of materials. In some embodiments, the support layer contains or is formed from one or more metals, such as Ti, Ni, Pt, Au, or combinations thereof. The catalyst layer can be formed from a variety of materials. In some embodiments, the catalyst layer contains or is formed from one or more metals, such as Al, Ni, Co, other transition metals, or combinations thereof. In some embodiments, Ti, Al, and Fe films having thicknesses of 100, 10, and 3 nm, respectively, were evaporated on the substrate. A carbon source gas, such as $C_2H_2$, was introduced into the reactor to form the nanotubes. The temperature and/or pressure used to growth the CNTs can vary, particularly in view of temperature constraints of the substrate. In some embodiments, the temperature is about 850° C. and the pressure is about 1 kPa. The growth time can also vary. In some embodiments, the growth time is from about 1 to about 5 minutes, preferably from about 1 to about 3 minutes.

In embodiments where the CNTs are grown from a catalyst and support layer, CNTs grow primarily through a base growth mechanism where the catalyst particles stay well adhered to the substrate and the CNTs grow from this root, the contact between the substrate and the CNTs interfaced with metal particle that adds resistance to the circuit. Therefore, in some embodiments it is not necessary to use an adhesion promoter layer (e.g., Ti) in the catalyst stack to facilitate transfer of the CNTs from the substrate for further processing to remove the catalyst particle and open the ends of the CNTs. Catalyst stacks, such as $Fe/Al_2O_3$, are known to produce weak substrate adhesion without the use of an adhesion promoting layer.

In other embodiments, the CNTs can be grown on a first substrate and transferred to the substrate for the diode array. Before transfer, the CNT ends can be processed to open them or they can remain closed. Then an electrically conducting bonding agent such as conducting polymer, metal, or organic surface modifiers is applied to the tips, which are bonding to an electrically conducting substrate. In some embodiments, this substrate is optically transparent.

A variety of substrates can be used to grow carbon nanotubes. Suitable substrates include, but are not limited to, silicon, metals, such as any of the metals described above, metal or metalloid oxides, such as those described above, ceramics, and combinations thereof.

B. Dielectric Coating/Tip Coatings

The CNTs are coated with a dielectric coating which can be applied using any technique known in the art. In some embodiments, the coatings are applied using atomic layer deposition (ALD). ALD can be used to deposit the ultrathin films of insulator with high conformity and precise control of thickness. The deposition is controlled at the atomic level by self-limiting surface reactions. Consequently, uniform and conformal deposition will occur on high aspect ratio porous structures because of self-passivating of the surface chemistry. Once the reaction is completed at one surface site, the reactants will continue to travel down the high aspect ratio pore and reach unreacted surface sites.

ALD typically contains four steps: 1) precursor-A exposure, 2) evacuation or purging of the precursors and any byproducts from the sample and chamber, 3) exposure of the reactant species-B, and 4) evacuation or purging of the reactants and byproduct molecules from the chamber. By repeating the surface reactions, oxide (e.g., alumina) growth is extremely linear with the number of AB cycles. In air, water vapor is adsorbed to most of the surfaces, forming hydroxyl groups. In general, precursors react with the hydroxyl groups, which serve as nucleation sites. The nucleation of ALD is important for continuous and pinhole-free ultrathin films.

The surface of CNTs are very inert and hydrophobic and do not generally contain the chemical species that allows the reaction with a precursor. Consequently, the ALD of $Al_2O_3$ on CNTs yields isolated nucleation and growth of nanosphere. These nanospheres eventually grow further and form a conformal thicker film, which increases diode resistance and limits the performances. To deposit a high quality conformal and thin ALD coating, CNT functionalization can be optimized for uniform nucleation and growth of oxide throughout the CNT surfaces by the use oxygen plasma with different powers and exposure times.

The tips can be coated with a metal, metal oxide, and/or other conducting material using techniques known in the art. In some embodiments, the metal, metal oxide, or polymer can be vapor deposited onto the tips. For those embodiments where a polymer coating is applied, the polymer can be spray coated or the device can be dipped into a polymer solution.

IV. Methods of Using Carbon Nanostructure (CNS)-Oxide-Metal Diodes

The diode arrays described herein can be used for a variety of applications, for example, solar-to-electric and solar-to-heat conversion as well as infrared (IR) detectors that operate at room temperature with lightweight and inexpensive materials military, security, and medical applications. Enhanced target acquisition, surveillance, night vision, etc. are some of the benefits that such IR detectors could provide for military and security applications. The devices can be used for a variety of opto-electronic systems including data transfer in computing and sensing (e.g., memory systems, such as memristors), and for terahertz detection applications.

In some embodiments, the devices described here can be coupled to an antenna to form a rectenna, such as a rectenna solar cell. These solar cells can be used for broadband solar-to-electric and solar-to-heat energy conversion. The devices described herein could supplement or supplant current concentrated solar power (CSP) heat absorbers. Rectenna convert alternative current (AC) solar electromagnetic waves into direct current (DC) power by receiving them in an antenna and rectifying the current in a diode. This process is fundamentally different from solar energy conversion in semiconductors, which is known to degrade significantly at elevated temperatures. Rectification at solar frequencies, however, requires extremely low diode capacitance, which is difficult to achieve with existing fabrication approaches.

In contrast, the devices described herein exhibit low capacitance in diode junction areas defined by the diameter of a multiwall CNT. Diodes in the CNT rectenna exhibited no significant change in performance at moderate elevated temperatures (e.g., 5° C.-77° C.) and over repeated cycles (e.g., excellent operational stability). The devices exhibit significant asymmetry between the forward (+V) and reverse (−V) current. This enables high rectification ratios, which are required for efficient rectenna energy conversion. They also benefit from the low intrinsic resistance of CNTs and field enhancement at CNT tips. Energy conversion efficiency is about 0.00002% for the current case of diode resistance equal to 20 GΩ, but, because efficiency scales as the inverse of diode resistance, could be increased to an efficiency of 40% by reducing the diode resistance to 10 kΩ, which is an achievable level.

An efficient and scalable approach to fabricate high density ($\sim 10^{10}/cm^2$) MWCNT-O-M tunnel diodes with excellent electrical performance is described herein. The MWCNT-O-M diode arrays produce previously unobserved combinations of high rectification ratios and current densities at low voltages and stable performance over multiple scans over a broad temperature range (e.g., 5 to 77° C.). In some embodiments, the rectification ratio is at least about 10, 15, 20, 25, 30, 35, 40, 45, 50, 55, or 60 at low operation voltages, such as 2.5 V. In some embodiments, the operation voltage is from about 0.3 to about 3.0 V, preferably from about 1.0 to about 2.5 V, more preferably about 2.0 V. In some embodiments, the devices exhibit the rectification ratio above and a tunneling current of at least about 1 to 10,000 A/cm$^2$, more preferably 100 to 10,000 A/cm$^2$, most preferably 5,000 to 10,000 A/cm$^2$. In some embodiment, the tunneling current is at least or about 7,800 A/cm$^2$ at low operational voltages, such as 2.5 V. This is a significant improvement over prior art M-O-M diodes, metal-oxide-CNT diodes, and planar devices as described in the examples.

A larger difference in work function between MWCNTs and the top metal electrode produced lower operational voltages and higher rectification ratios. The effective barrier thickness in MWCNT-O-M diodes was estimated from measured data to be nearly two-fold smaller than the effective thickness in equivalent planar devices most likely because of geometric field enhancement at the MWCNT tips.

The data described herein using semi-transparent top metal electrodes show photo-current and photo voltage under exposure to 1000 W/m$^2$ AM1.5 illumination from a solar simulator at zero applied bias. A large increase in current density for a given applied bias in the J-V curves under solar illumination demonstrates that CNT rectenna devices described herein operate as photodetectors at room temperature and at solar frequencies. The observation of a measurable photo current and photo voltage under solar illumination at zero bias also suggests that the architecture is an energy-harvesting device in addition to a photodetector. This data was obtained using a low transparency top metal contact, without matching the length of the antenna to the incident EM wavelengths. It was observed that lowering the barrier height at the oxide/top metal interface (e.g., Ca electrode devices) improves the rectification/asymmetry of the diode in comparison to the devices with higher barrier height at the insulator/top electrode interface (e.g., Al electrode devices).

When the diode resistance is much greater than the antenna resistance, the cutoff frequency for rectenna is defined as $$f_c = 1/2\pi \cdot R_A \cdot C_D$$

where $R_A$ is the antenna resistance and $C_D$ is the capacitance of the rectenna diode. The measured capacitance of the devices described herein is estimated to be 2 attofarads. A reasonable estimate of the antenna resistance is 100Ω. Thus, $f_c$ is estimated to be about 800 THz, which is equivalent to a cutoff wavelength of 375 nm and shows that CNT rectenna arrays can convert the full infrared and visible solar spectrum to electricity.

The voltage coupled to the antenna of a rectenna can be expressed as:

$$V = (2/\pi)^{1/2} \cdot (R_A \cdot G)^{1/2} \cdot (P_{solar\_t})^{1/2} \cdot \lambda$$

where G is the antenna gain, $P_{solar\_t}$ is the incident solar flux transmitted through the top contact in the rectenna device, and $\lambda$ is the solar wavelength.

The voltage transferred to the diode to generate power is:

$$V_D = V^2/[1+(\omega \cdot C_D \cdot R_A)^2]$$

where $\omega$ is the angular frequency of the solar electromagnetic radiation and $C_D$ is the capacitance of the rectenna diode. $V_D$ was measured to be approximately 1 mV under zero bias AM1.5 0.1 W/cm$^2$ solar illumination at 10% estimated transmission through the device top contact. In the same device, the resistance of a single CNT-oxide-metal diode ($R_D$) was measured to be 20 GΩ.

For the purpose of demonstrating the effect of reduced diode resistance on rectenna efficiency, if one assumes $V_D$=1 mV, the rectenna current is given as $$i = (\gamma \cdot V_D^2)/(4 \cdot R_D)$$

where $\gamma$ is the current responsivity of the diode (i.e., ratio of second to first derivative of current with respect to voltage). The devices described herein exhibit rectenna currents as high as 16 at room temperature. Such values may be less at elevated temperatures due to thermally excited electrons leaking through the oxide barrier.

The current for the array of CNT rectenna is given as i·N, where N is the number density of CNTs in an array ($10^{10}$ CNT/cm$^2$—the estimate of diode resistance is based on this same number density). Current densities on real devices ranged from 0.1 to 1 μA/cm$^2$, which is in reasonable agreement with estimates based on i·N. The rectenna power can be expressed simply as $V_D \cdot i$. The solar-to-electric rectenna efficiency CNT array-based devices described herein can be expressed as:

$$\eta = (V_D \cdot i \cdot N)/P_{solar\_t} = (\gamma \cdot V_D^2 \cdot N)/(4 \cdot R_D \cdot P_{solar\_t})$$

η=0.00002% for the current case of $R_D$=20 GΩ but can be increased to η=40% if $R_D$ is reduced to 10 kΩ. When $R_D$ is reduced such that $R_D \gg R_A$ is no longer valid, then $V_D$ is reduced along with $R_D$ such that η is never greater than 1. With an expected transmittance of 70% for candidate Ca/Ag top metal contact, the effective device solar-to-electric efficiency is expected to be at least 28%.

EXAMPLES

Materials and Methods
  Electrical measurements
  The current-voltage (J-V) characteristics of MWCNT-O-M diode arrays were measured using an Agilent E5272A source monitor unit connected to a DC electrical probing station with a temperature-controlled stage. The resistance of the probe and lead wires is on the order of 1Ω. Capacitance-frequency characteristics were measured using HP 4284 capacitance meter at room temperature. The capacitance, and the operating electric field strength limits in MWCNT-O-M devices were established by measuring specific capacitances as a function of DC bias for oxide thicknesses of 8 and 15 nm at a frequency of 105 Hz and 20 mVrms. The measured capacitances were constant from −2.75 to 2.75 V and −3 V to +3 V for 8 and 15 nm oxides respectively, which indicates that there was no detectable damage to the oxide barriers while collecting the J-V characteristics of the MWCNT-O-M diode arrays.

Rectenna Measurements

An infrared (IR) cw laser with 1064 nm wavelength (~281 THz) was used to test rectenna response. The open circuit DC voltage was measured by rotating polarization angle of the laser beam with respect to the MWCNT antenna alignment. The polarization of the IR laser beam was controlled using a half waveplate, and a linear polarizer.

Work Function Measurements

The work functions of MWCNTs were measured in air using a Kelvin probe (Besocke Delta Phi) with reference to a highly ordered pyrolytic graphite (HOPG) crystal sample.

Structural Morphology Analysis

Scanning electron microscope (SEM) characterization was performed using field emission electron microscope (Ziess Ultra-60) to analyze the structure and morphology of as grown and oxide coated CNT arrays. Transmission electron microscope (TEM) analysis was conducted using JEOL 4000EX on few oxide coated samples. Atomic force microscope (AFM) measurements on planar device structures) were made using an Agilent (Pico) instrument with silicon-nitride tips.

Example 1. Device Fabrication

Vertical arrays of CNTs were grown on single crystal Si substrates using a low-pressure chemical vapor deposition (LPCVD) process at 85° C. and 1 kPa in an Aixtron Black Magic® reactor with $C_2H_2$ as the carbon source gas. Ti, Al, and Fe films with thicknesses of 100, 10, and 3 nm were evaporated onto the Si as support and catalyst layers for CNT growth. The growth time was between 1 to 3 minutes to produce MWCNTs with average heights of 5-8 μm. The average diameters of the MWCNTs were approximately 7-8 nm and the average number of walls was 6.

$Al_2O_3$ dielectric layers of 5, 8, 12, or 15 nm were deposited on the MWCNTs by ALD at 250° C. using trimethylaluminum (TMA) and water ($H_2O$) vapors. These thicknesses were based on optimized ALD cycles (100 cycles=10 nm), which were calibrated on Si substrates. Purge times of 30 seconds were used in each ALD cycle for both TMA and H2O to enable TMA and $H_2O$ vapor to diffuse completely from the MWCNT tips to the substrate base. A 5-min oxygen plasma in between two sets of ALD cycles was used to facilitate uniform nucleation and conformal coating on to the array of MWCNT.

A metal top contact of Al (150 nm) or Ca (40 nm)/Al (100 nm) was then vacuum deposited on the arrays using a shadow mask to form the MWCNT-O-M devices. The relatively high density of MWCNTs in the arrays combined with the higher deposition rate compared to ALD confined the vacuum deposited top metal contacts to the tip region of the MWCNT-O-M arrays.

The arrays with qualitatively straighter and less entangled MWCNTs were prepared by depositing a SiOx barrier layer (250 nm) on half of a Si substrate, and depositing CNT catalyst layers on the other half of the substrate. This design prevents punch-through into the active area while probing large areas of the MWCNT-O-M diodes, and is useful when semitransparent top metal electrodes would be required for rectenna applications. The CNTs were prepared using the same growth conditions detailed above.

A schematic of device fabrication is shown in FIG. 1.

Example 2. Electrical Measurements of CNT-O-M Devices

Figure 2A:
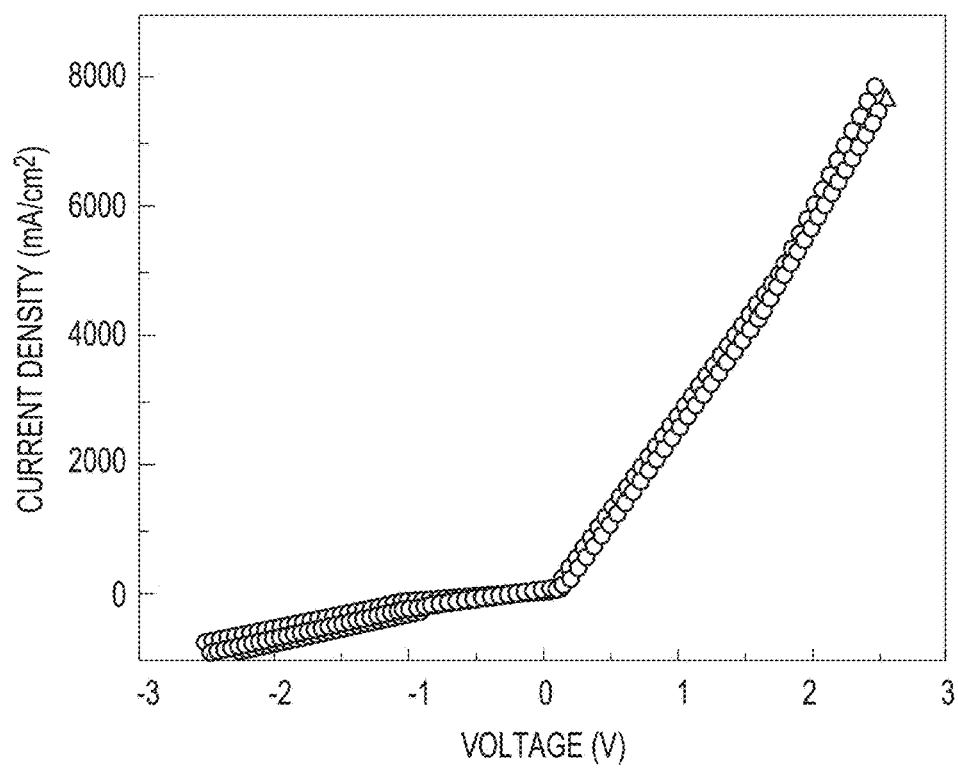
FIG. 2a is a graph showing current density ($mA/cm^2$) as a function of voltage (V) (J-V characteristics) for six (6) different multiwall carbon nanotube-oxide-metal (MWCNT-O-M) devices with effective areas of 0.01 $cm^2$. An optical image of two different devices is shown in FIG. 2e.
Figure 2B:
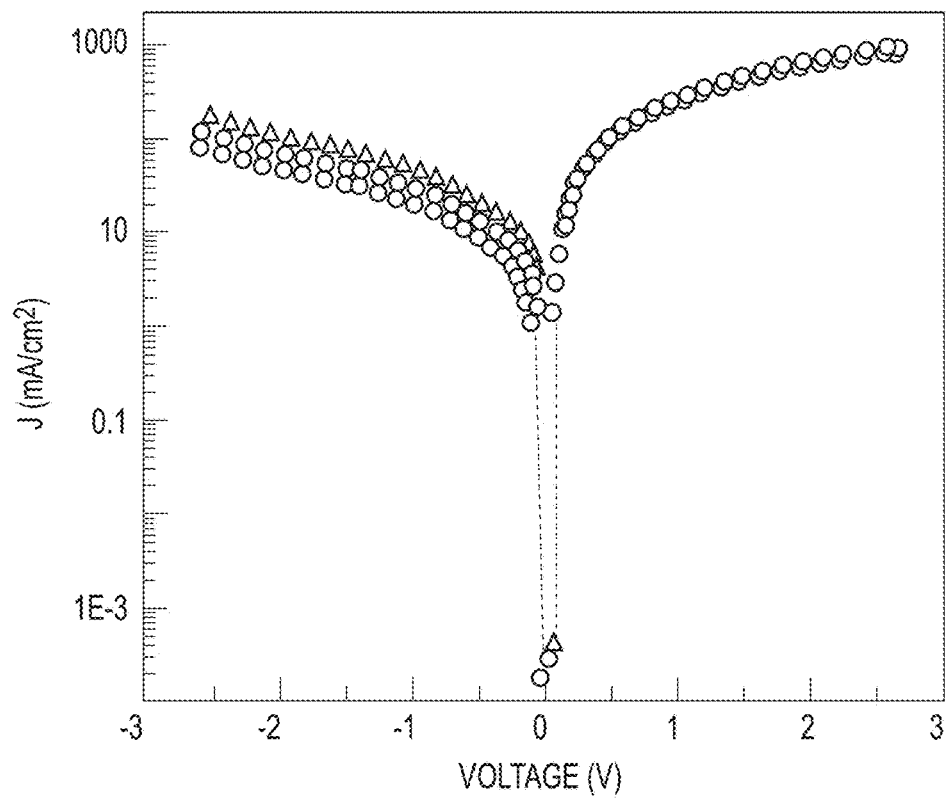
FIGS. 2b and 2d are semi-logarithmic plots of the data which show the significant asymmetry between the forward (+V) and reverse (−V) current.
Figure 2C:
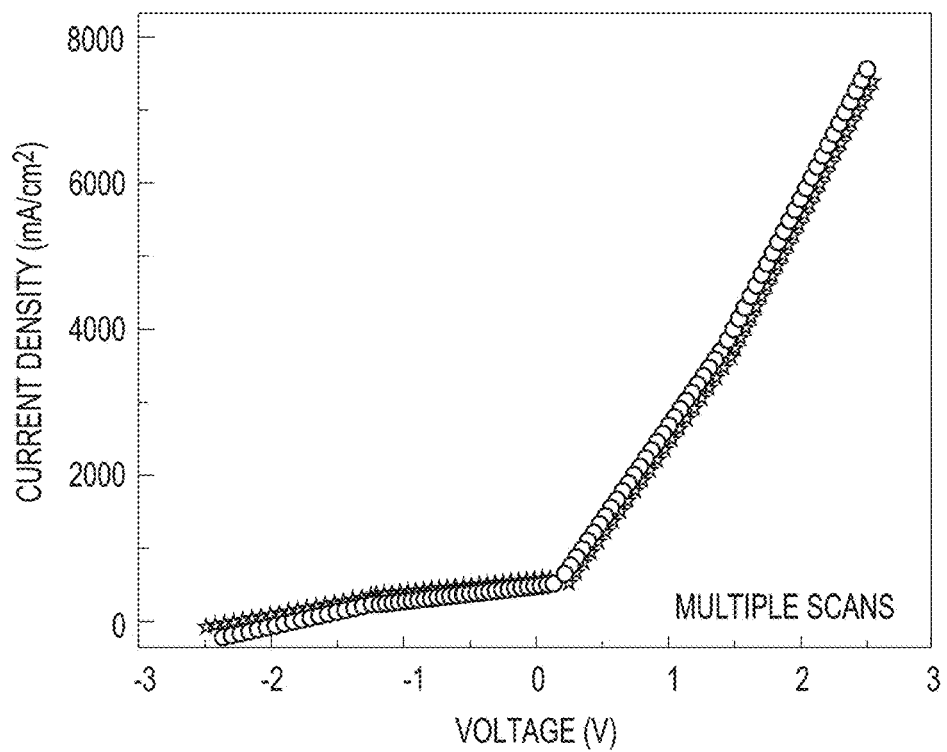
FIG. 2c is a graph showing current density ($mA/cm^2$) as a function of voltage (V) (J-V characteristics) during multiple voltage scans.
Figure 2D:
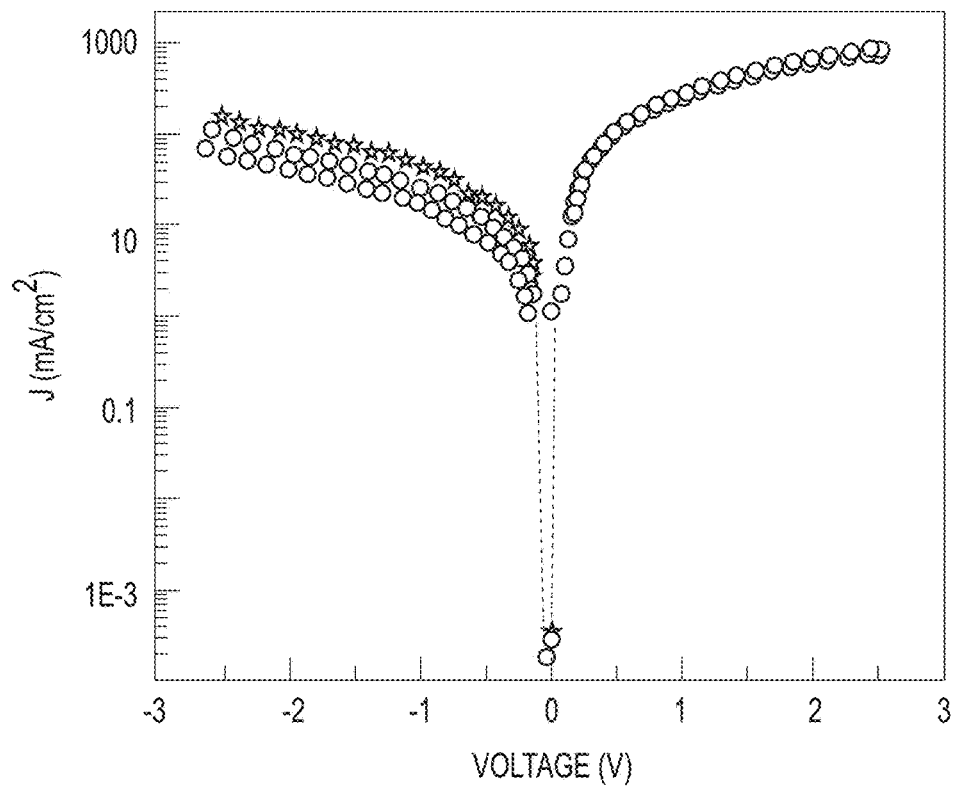
Figure 2E:
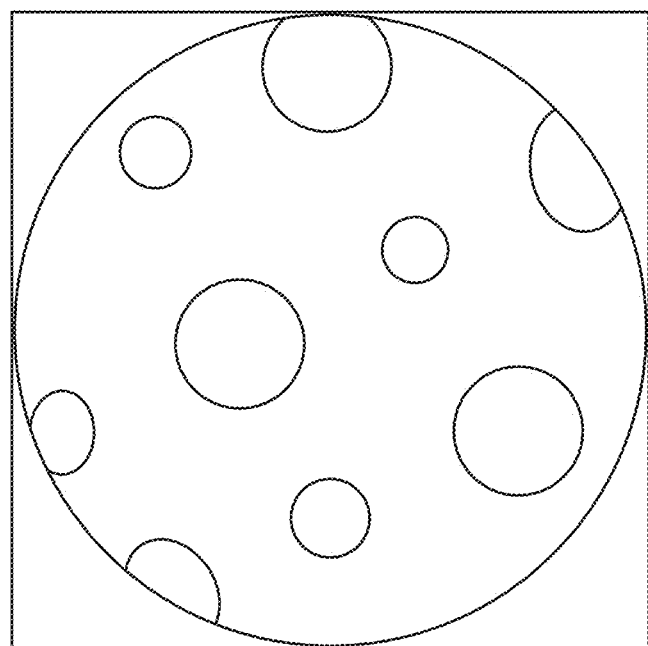

Electrical measurements of CNT-O-M (Ca) devices were performed. FIG. 2a shows exceptional reproducibility of J-V characteristics measured on six different MWCNT-O-M (Ca) devices with effective areas of 0.01 $cm^2$. The area of the top metal electrode defines the effective area for all devices unless stated otherwise. An optical image of two different device areas over a 1×1 inch substrate is shown in FIG. 2e. The J-V characteristics of the MWCNT-O-M devices were consistent during multiple voltage scans (12 times) as shown in FIG. 2c, demonstrating their excellent operational stability. FIGS. 2b and 2d show semi-logarithmic plots of the data, which highlight the significant asymmetry between the forward (+V) and reverse (−V) current.

The devices produced extremely high tunneling currents of 7,800 A/$cm^2$ and rectification ratios (the ratio of forward to reverse current) of approximately 10.5 at low operational voltages of 2.5 V. The minimum current through an individual MWCNT-O-M diode junction is estimated to be 0.77 nA at 2.5 V based on the number density (~$10^{10}$/$cm^2$) and outer diameter (7-8 nm) of MWCNTs produced using the methods described herein. This value is several orders of magnitude lower than the currents required to produce significant Joule heating in prior art MWCNTs. Currents higher than this estimated minimum could have been produced considering that some MWCNTs can be uprooted during growth, which would decrease the number density of active diode junctions. However, such changes are expected to within an order of magnitude of the original number density based on images taken at the end of the processing steps.

The attractive electrical characteristics discussed above for MWCNT-O-M diodes compare favorably to prior M-O-M diode demonstrations. Transfer-printing with ultra-thin (3.6 nm) AlOx produced rectification only at higher voltages (>±3.5 V) and with substantially lower currents. Diodes with ALD deposited $Al_2O_3$ (<10 nm) and different combinations of electrode work function produced substantially lower currents (nA) and rectification ratios (~1.5) at much higher voltages (±4 V). Other M-O-M diodes produced much lower currents in devices with a greater degree of fabrication complexity.

A recent study demonstrated metal-oxide-CNT structures where vertically aligned CNTs were grown on a thin oxide to form the diode junctions, produced a total current of 22 nA at 4 V (the device area was not reported). The maximum tunnel currents produced by the MWCNT-O-M vertical diode arrays in this study (~78 mA or 7,800 mA/$cm^2$) are several orders of magnitude higher at significantly lower voltages. Moreover, the high temperatures required for direct CNT growth on thin oxide barriers can cause the catalyst metal to diffuse into the oxide making device shorts and inconsistent performance very likely.

Planar device geometries that formed Schottky junctions with single-wall CNTs (SWCNTs) or MWCNTs, devices with metal/Si or CNT/nanowire or SWCNT/MWCNT structures all produced maximum currents in the nA-μA range.

These results indicate that vertical arrays of MWCNT-O-M tunnel diodes as fabricated here can offer superior performance and simpler fabrication compared to other M-O-M or nanostructure-based rectifying devices.

Figure 3A:
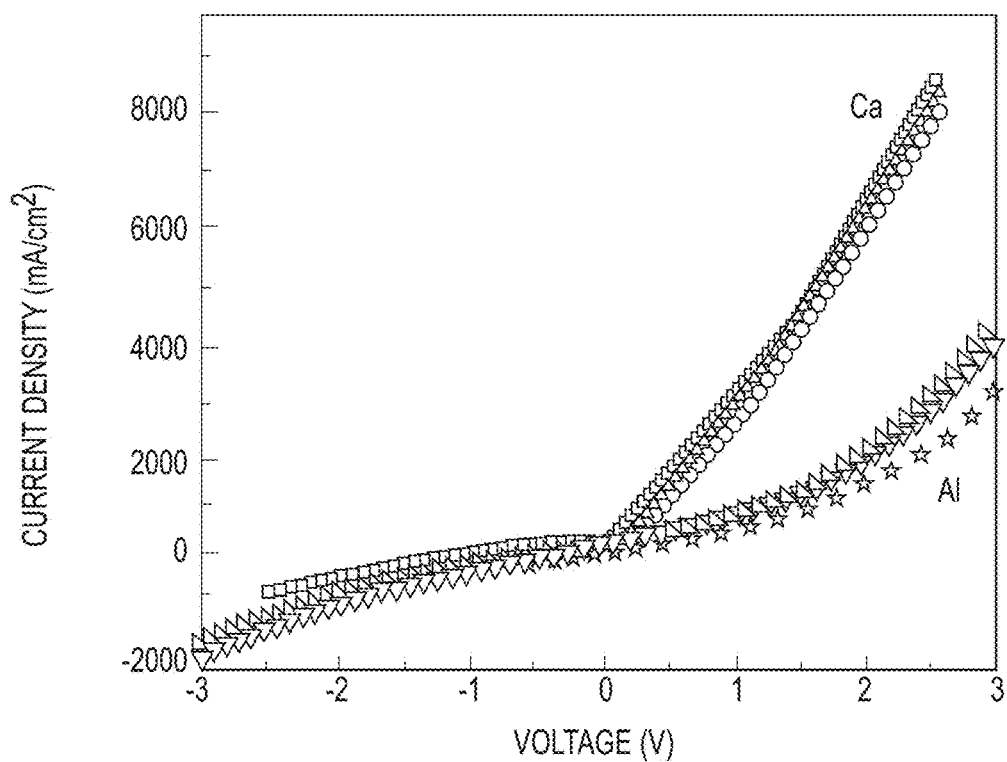
FIG. 3a is a graph showing current density (mA/cm$^2$) as a function of voltage (V) (J-V characteristics) for several devices (area=0.01 cm$^2$) that use either Ca or Al as the top electrode on the same batch of oxide-coated MWCNT arrays.
Figure 3B:
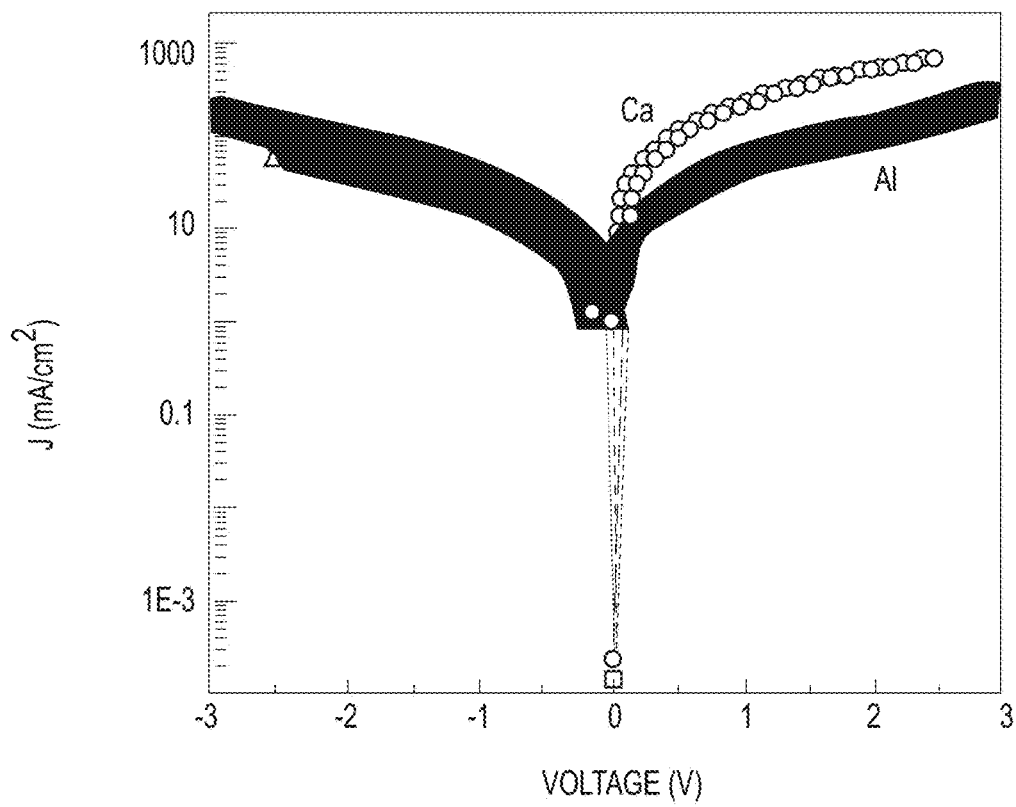
Figure 4:
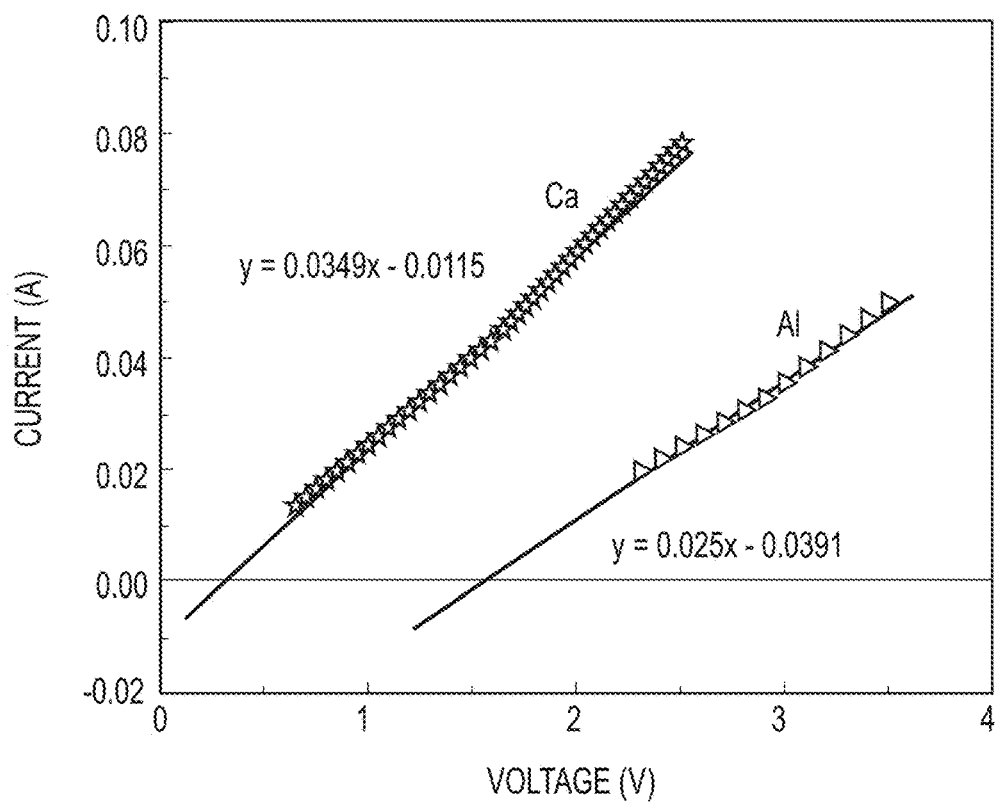
FIG. 4 is a graph showing current (A) and a function of voltage for Ca and Al as the top electrode.

FIG. 3a compares J-V characteristics of several devices (area=0.01 cm$^2$) that use either Ca or Al as the top electrode on the same batch of oxide-coated MWCNT arrays. The higher rectification and lower turn-on voltage (FIG. 4) using Ca (~10.5 and 0.3 V, respectively) versus Al (~2 and 1.6 V, respectively) is attributed to the ~1.4 eV lower work function of Ca Similar trends in the J-V characteristics were observed when the work function of the MWCNTs (bottom electrode) was different.

Figure 3C:
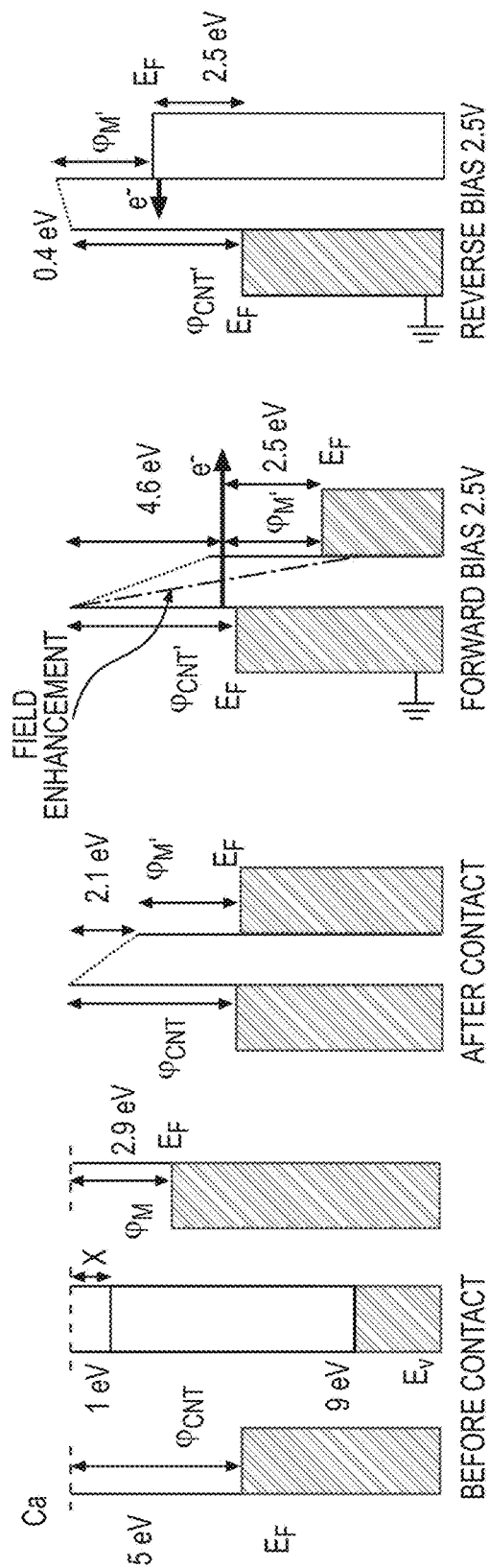
FIG. 3c is an energy level diagram showing the potential effects of work function contrast and field enhancement on the resistance to electron tunneling in MWCNT-O-M devices.
Figure 5:
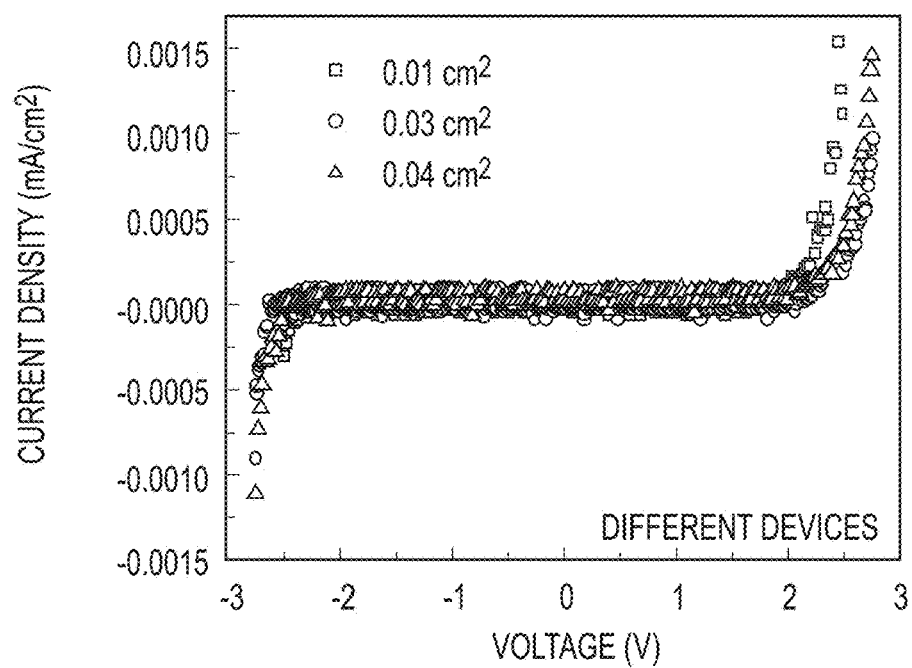
FIG. 5 is a graph showing current density (mA/cm$^2$) as a function of voltage (V) (J-V characteristics) for planar Au—Al$_2$O$_3$—Ca diodes designed to match the contrast in work function and oxide thickness in the MWCNT-O—Ca devices as a function of area.

The differences in turn-on voltage and rectification ratio between Ca and Al toped devices were also similar for devices fabricated in different batches and with different areas. Diode rectification and turn-on voltage could also be affected by geometric field enhancement at MWCNT tips. Therefore, planar Au—Al$_2$O$_3$—Ca diodes, which were designed to closely match the contrast in work function and oxide thickness in the MWCNT-O—Ca devices, were tested for comparison (FIG. 5). The planar devices yielded rectification ratios (~1.2 at ±2.75 V DC bias) and tunnel currents (~1.5 μA/cm2 at 2.75 V) that are several orders of magnitude lower than the currents produced in the MWCNT-O—Ca diodes (FIG. 3a). These results suggests that reduced effective barrier resistance due to geometric field enhancement could contribute significantly to the much higher tunnel currents and asymmetry achieved in the MWCNT-O-M diodes. A simple energy level diagram is shown in FIG. 3c to illustrate the potential effects of work function contrast and field enhancement on the resistance to electron tunneling in MWCNT-O—Ca devices. Since the field enhancement is only expected in the forward direction, it contributes to unidirectional thinning of the tunneling barrier. This is because a single diode can be viewed roughly as a MWCNT point contact emitter against a planar surface.

Figure 3D:
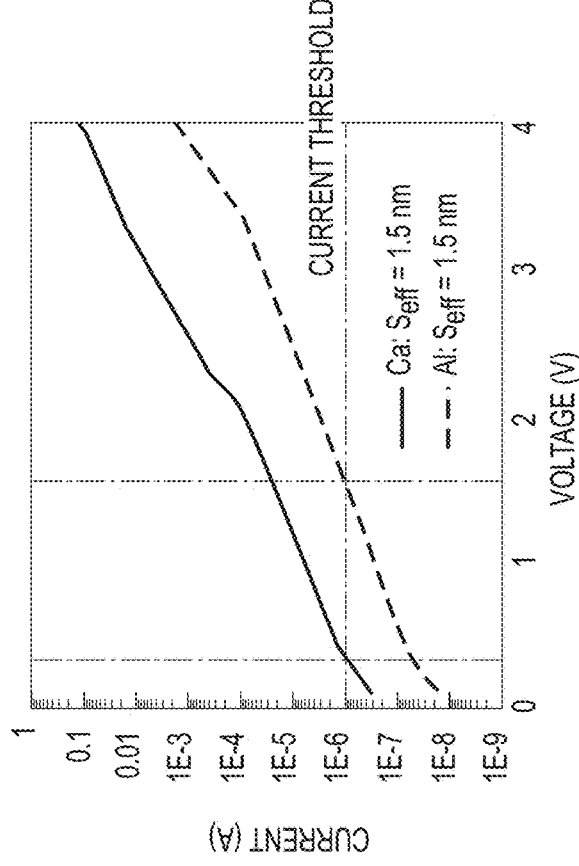
FIG. 3d is a graph showing current (A) as a function of voltage (V) (turn on voltage) for MWCNT-O—Al and MWCNT-O—Ca devices.
Figure 6A:
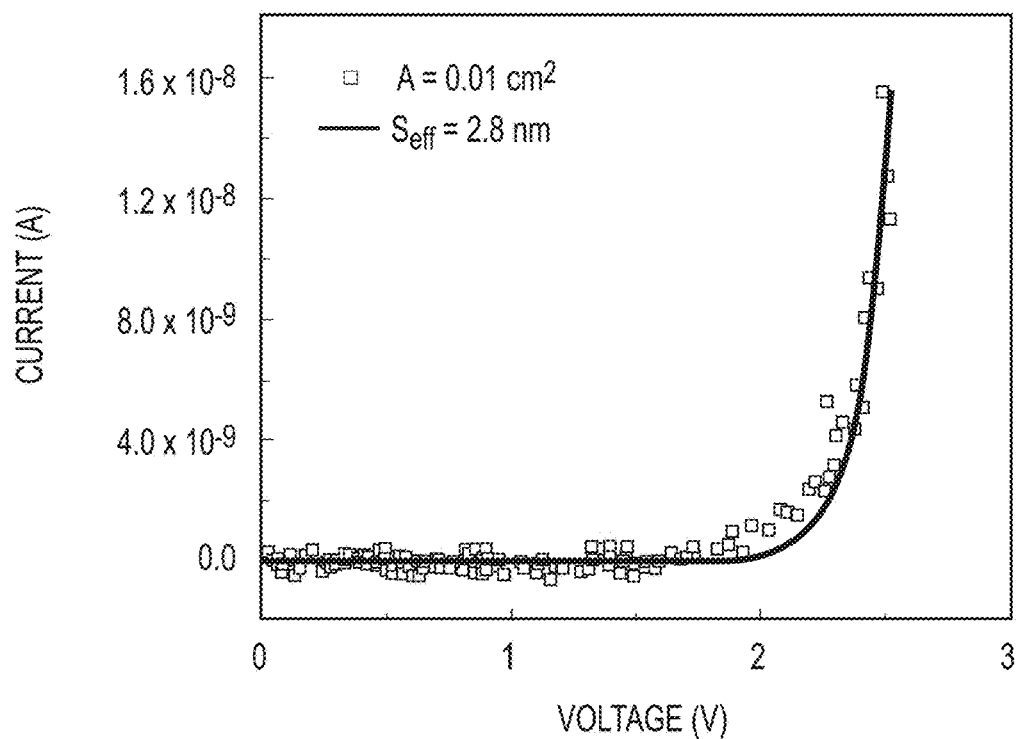
FIGS. 6a-c are graphs showing current (A) as a function of voltage (V) for planar devices having areas of 0.01 cm$^2$ (FIG. 6a), 0.03 cm$^2$ (FIG. 6b), and 0.04 cm$^2$ (FIG. 6c) equivalent to MWCNT-O-M devices.
Figure 6B:
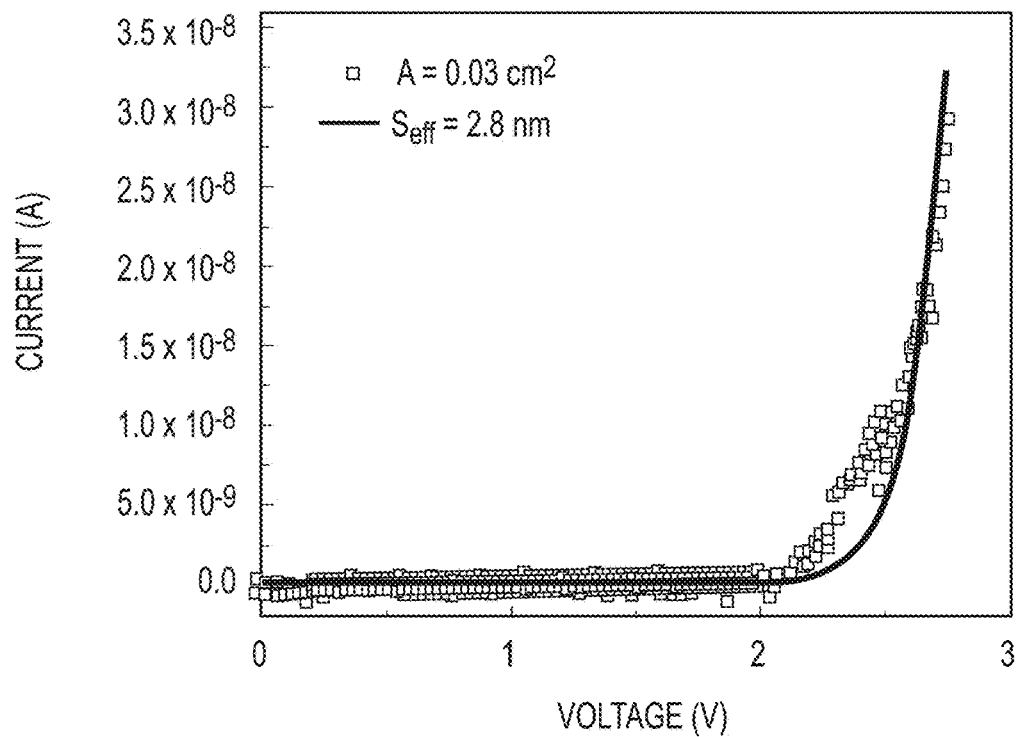
Figure 6C:
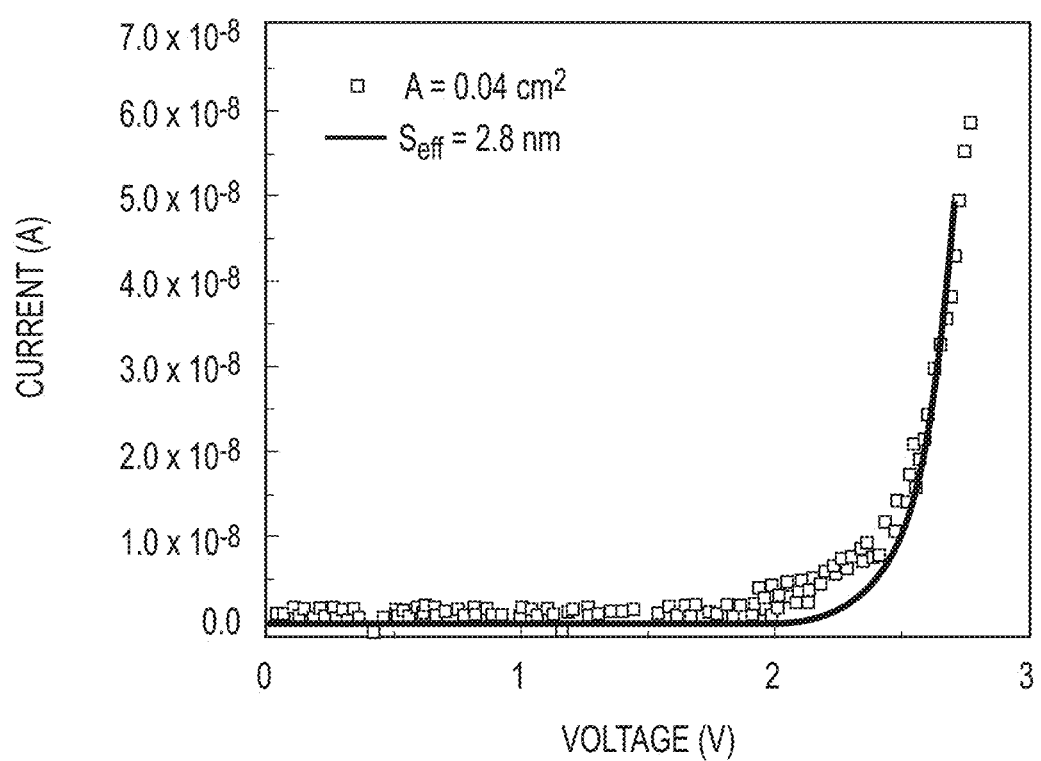

The electron tunneling equations from Simmons are often used to fit experimental data for M-O-M diodes. However, it has been shown that while these equations predict the behavior of planar structures qualitatively, the current density is often under-predicted significantly. The J-V curves of CNT devices often differs somewhat from the exponential relationship between current and voltage in previous studies, which is consistent with the observation in the MWCNT device data described herein. Understanding the limitations of this theory, the Simmons equations were used to demonstrate that the difference in turn-on voltages of the MWCNT-O—Al and MWCNT-O—Ca devices can be attributed to the difference in work function of Al and Ca, ~1.4 eV (FIG. 3d), as concluded above from the experimental data. Based upon the turn-on voltage, the MWCNT-O—Ca and MWCNT-O—Al devices with 8 nm of deposited oxide are found to have identical effective tunneling barrier thicknesses of 1.5 nm (from FIG. 3d), which are nearly twofold smaller than the thicknesses in equivalent planar devices (2.8 nm from FIGS. 6a-6c). These results support the conclusion that there is field enhancement in the MWCNT devices contributing to higher current density.

Figure 7A:
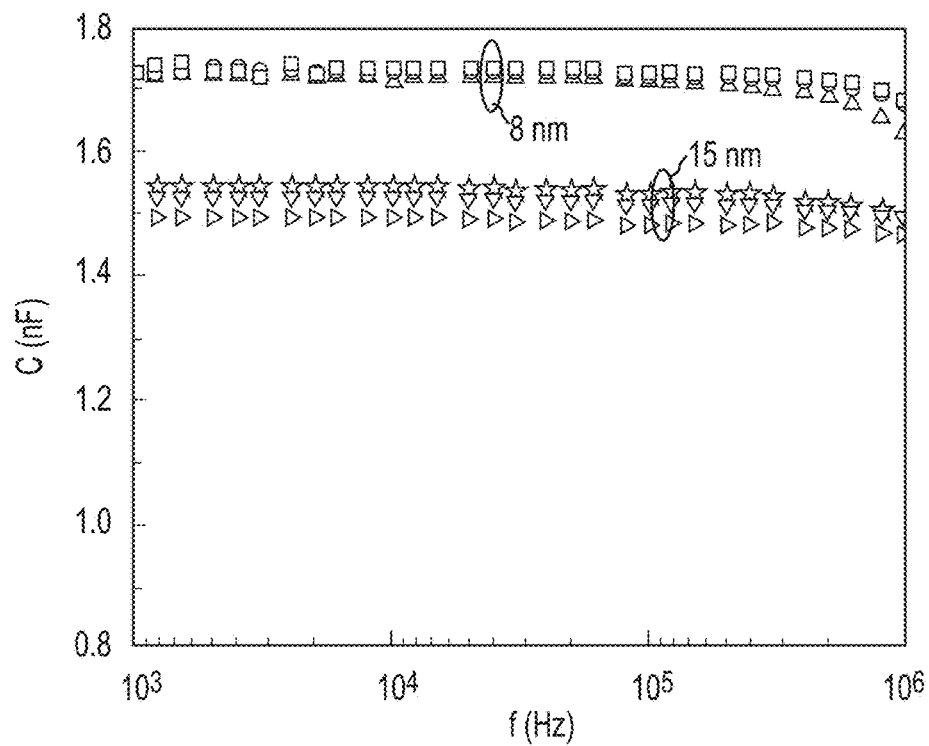
FIG. 7a is a graph showing the capacitance based on a device area of 0.1 cm$^2$ of MWCNT-O-M diode arrays with different oxide thicknesses.
Figure 7B:
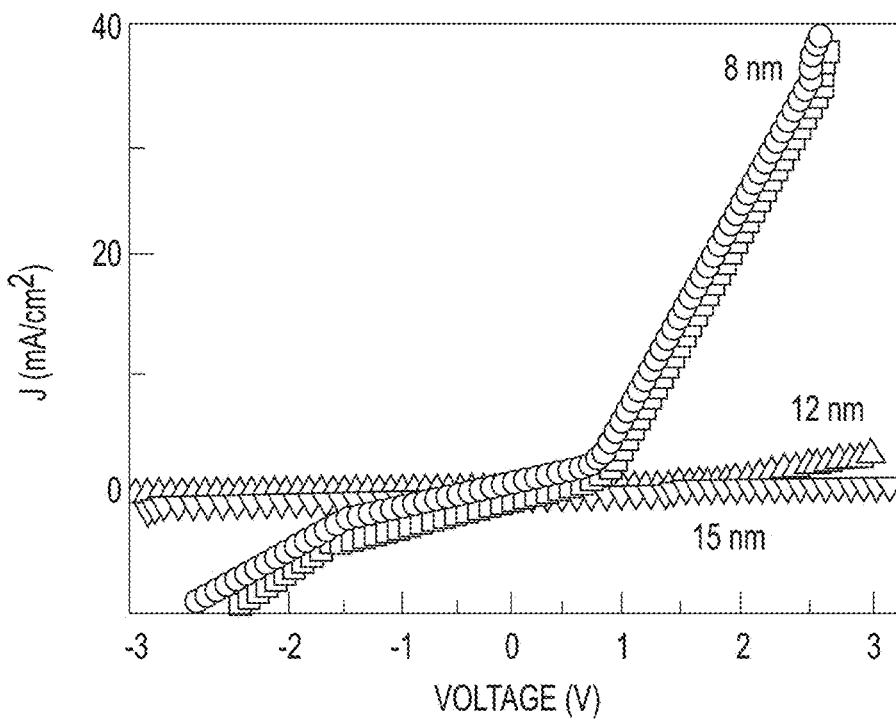
Figure 8:
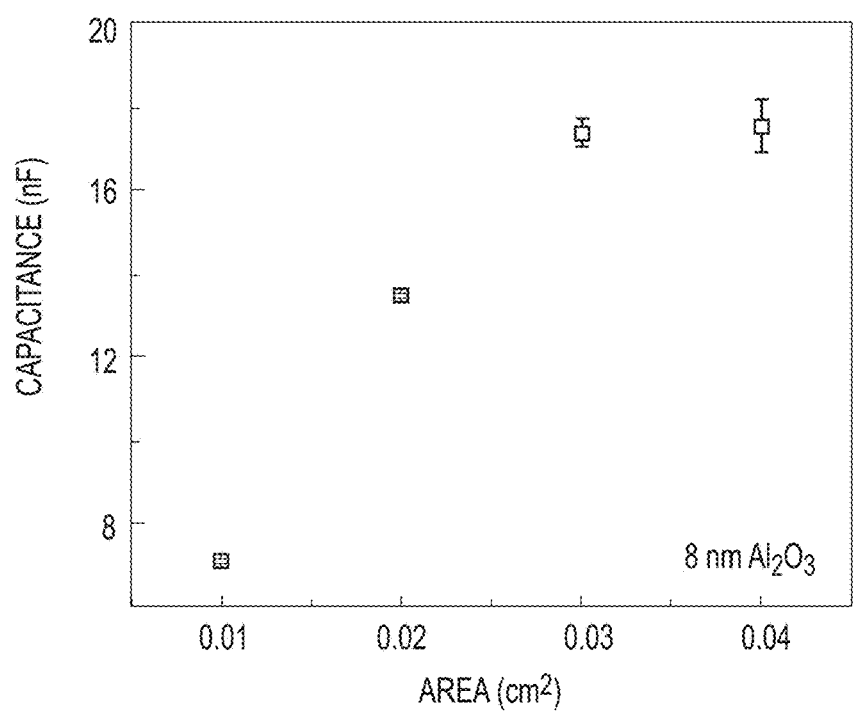
FIG. 8 is a graph showing capacitance as a function of area for a planar device equivalent to MWCNT-O-M devices.

The measured capacitances (C) based on the apparent device area (0.1 cm$^2$) of MWCNT-O-M diode arrays with different oxide thicknesses are shown in FIG. 7a to be nearly constant in the frequency range of our measurement capabilities (up to 106 Hz). The results do not show the inverse thickness relation of a conventional parallel plate capacitor because the permittivity of nanoscale oxide insulators can decrease with thickness. Considering the much smaller real or active device area (0.5×10−3 cm$^2$) estimated from number density of MWCNTs observed in SEM (~1010/cm$^2$) and the MWCNT diameter (8 nm), specific capacitances of approximately 3.4 μF/cm$^2$ or approximately 2 attofarads per MWCNT junction, and a dielectric constant (ε) of 3.8 are extracted from FIG. 7a for the MWCNT-O-M arrays fabricated with 8 nm Al$_2$O$_3$. An ε of 5.14 is extracted from measurements on equivalent planar devices (FIG. 8). Considering the large uncertainty in determining the active MWCNT-O-M diode areas based on counting MWCNTs in SEM, the ε of both MWCNT and planar diodes agree with reported values for the dielectric constant of ALD Al$_2$O$_3$ in this thickness range.

Figure 7C:
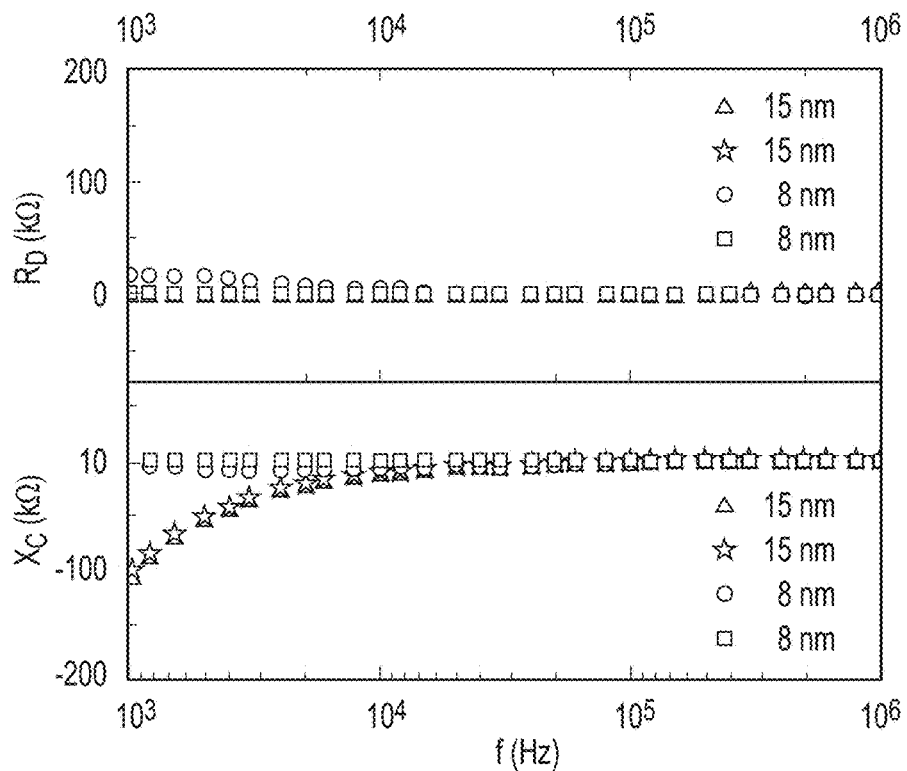
FIG. 7c is a graph showing impedance of the MWCNT-O-M device with 8 and 15 nm thick layers of Al$_2$O$_3$ assuming a parallel combination of capacitive reactance (Xc) and resistance (RD).

The impedance of the MWCNT-O-M diode arrays with 8 and 15 nm of Al$_2$O$_3$ were measured assuming a parallel combination of capacitive reactance (Xc) and resistance (RD) (FIG. 7c). At low frequencies, Xc is higher for the devices with 15 nm oxides as expected. At frequencies above approximately 104 Hz both oxide thicknesses produce similar magnitudes of low RD and Xc, which correspond to impedance values of 2-106Ω at 106 Hz and 20 mVrms. The real part of impedance is 2-714Ω at this frequency, which is in agreement with the range of DC resistances for Ca and Al devices at zero bias 307-423Ω (defined as $(A \cdot dJ/dV)^{\wedge}(-1)$ at Vbias≈0). Considering the number density of MWCNTs in the arrays, the range of single junction resistances is 20-7140 GΩ These resistances include the intrinsic resistance of the oxide-coated MWCNT and contact resistances, and the resistance of the oxide barrier, which increases exponentially with the oxide thickness. The single junction resistances are 4-7 orders of magnitude larger than what is typically observed for MWCNTs and their contacts so these high resistances can most likely be attributed to the relatively thick oxide tunnel barriers at zero or low bias.

Figure 9A:
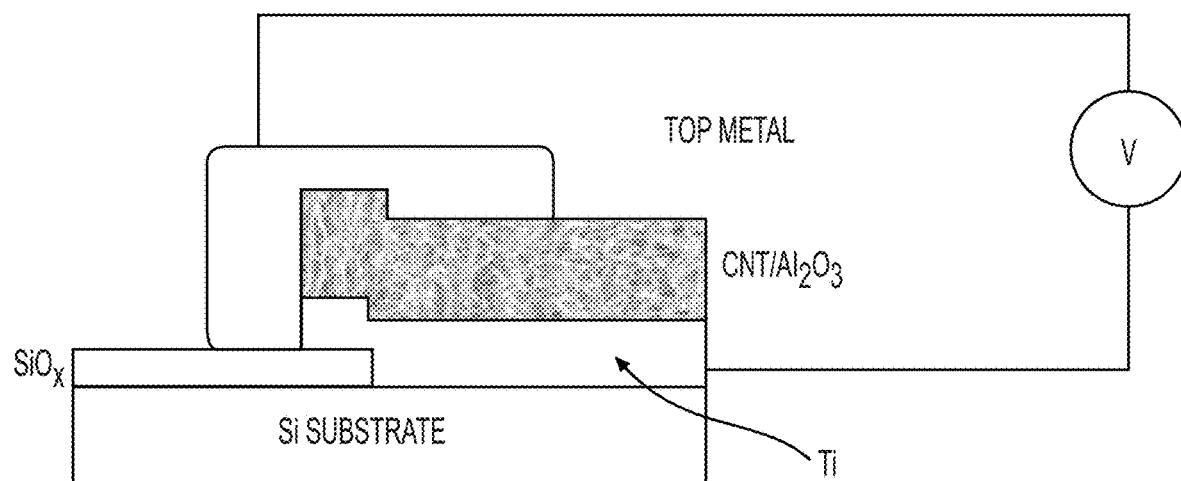
FIG. 9a is a schematic of a MWCNT-O-M device.
Figure 9A:
Figure 9B:
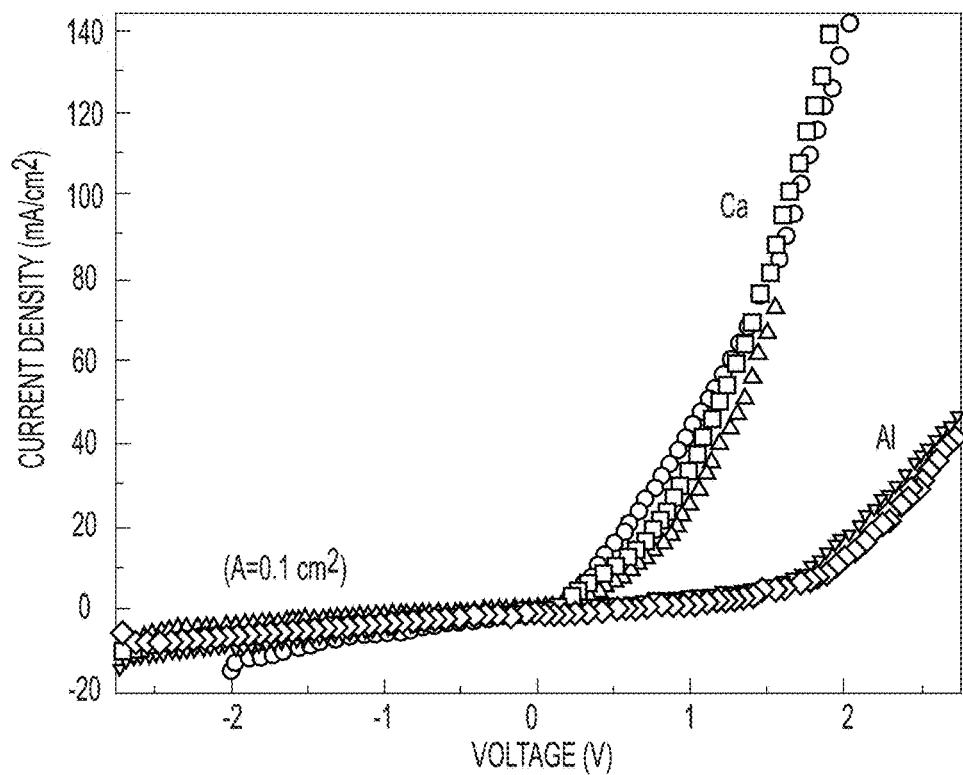
FIG. 9b is a graph showing current density (mA/cm$^2$) as a function of voltage (V) for MWCNT-O-M where M is Ca and Al.
Figure 9C:
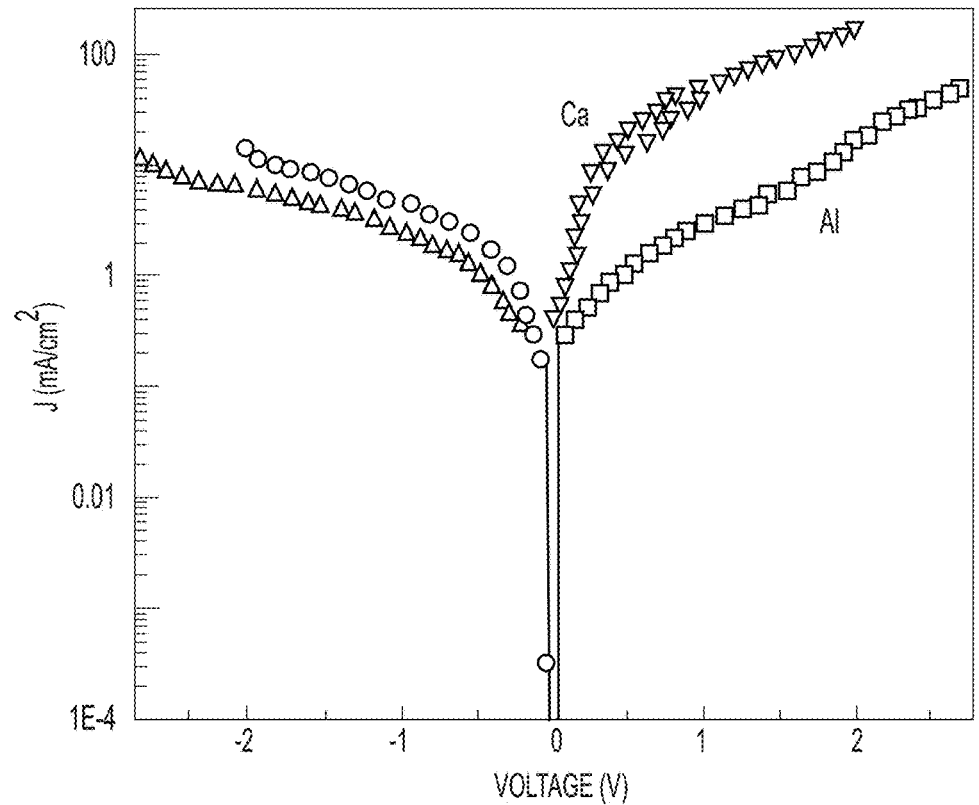
FIG. 9c shows a semi-logarithmic plot of the current density (mA/cm$^2$) as a function of voltage (V) for MWCNT-O-M where M is Ca and Al.

Several MWCNT-O-M devices with areas of 0.0025, 0.01, and 0.1 cm$^2$ were fabricated to demonstrate scaling (FIG. 9a). Rectification ratios in the devices with Ca (10-12@±2 V) and Al (2.5@±2 V) top electrodes at 0.1 cm$^2$ (FIG. 9b) agree with theoretical expectations and the trends displayed in the devices with smaller areas. However, the total current did not increase with area as expected, possibly because of reduced contact between MWCNTs and the top electrode that results from increased non-uniformity of MWCNT heights in arrays grown over larger areas.

Figure 10A:
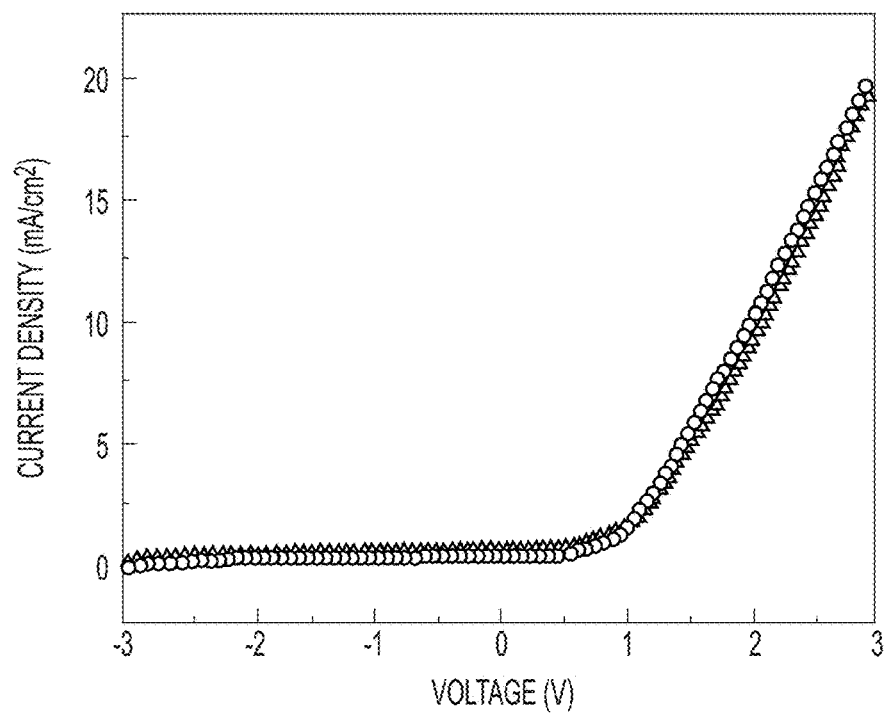
FIG. 10a is a graph showing current density (mA/cm$^2$) as a function of voltage (V) for straighter and less entangled MWCNT-O-M diodes where M is Ca and Al.
Figure 10B:
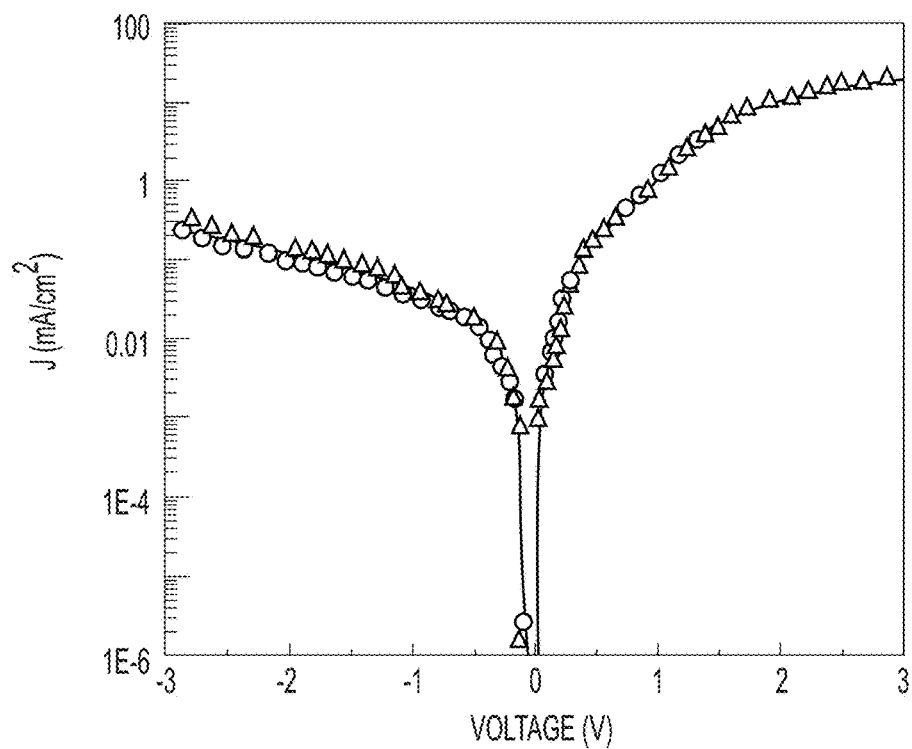
FIG. 10b shows a semi-logarithmic plot of the current density (mA/cm$^2$) as a function of voltage (V) for MWCNT-O-M where M is Ca and Al.
Figure 10C:
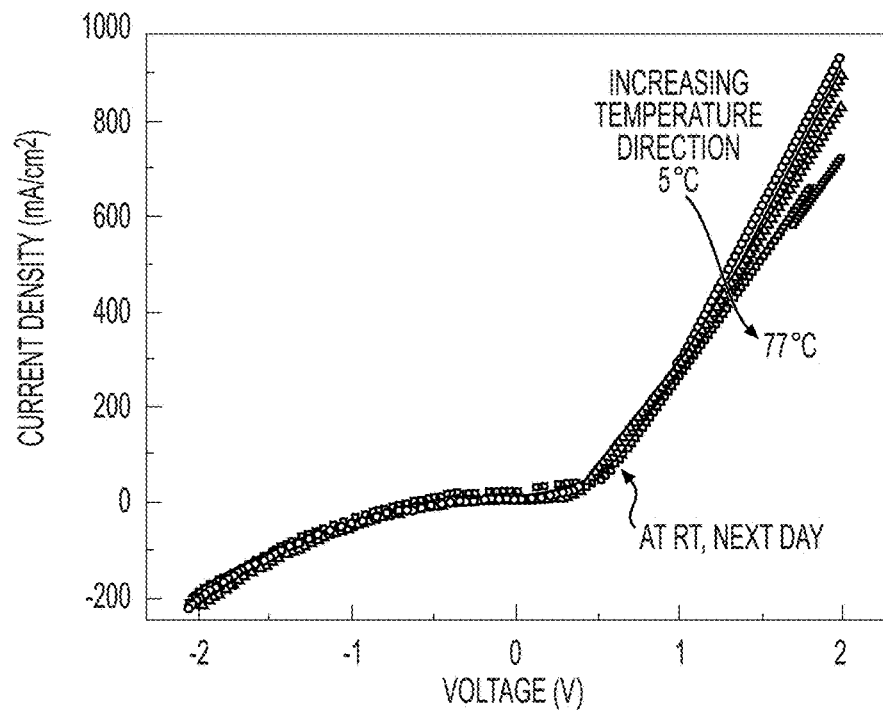
FIG. 10c is a graph showing current density (mA/cm$^2$) and J(mA/cm$^2$), respectively, versus voltage (V) for MWCNT-O-M as a function of temperature.
Figure 10D:
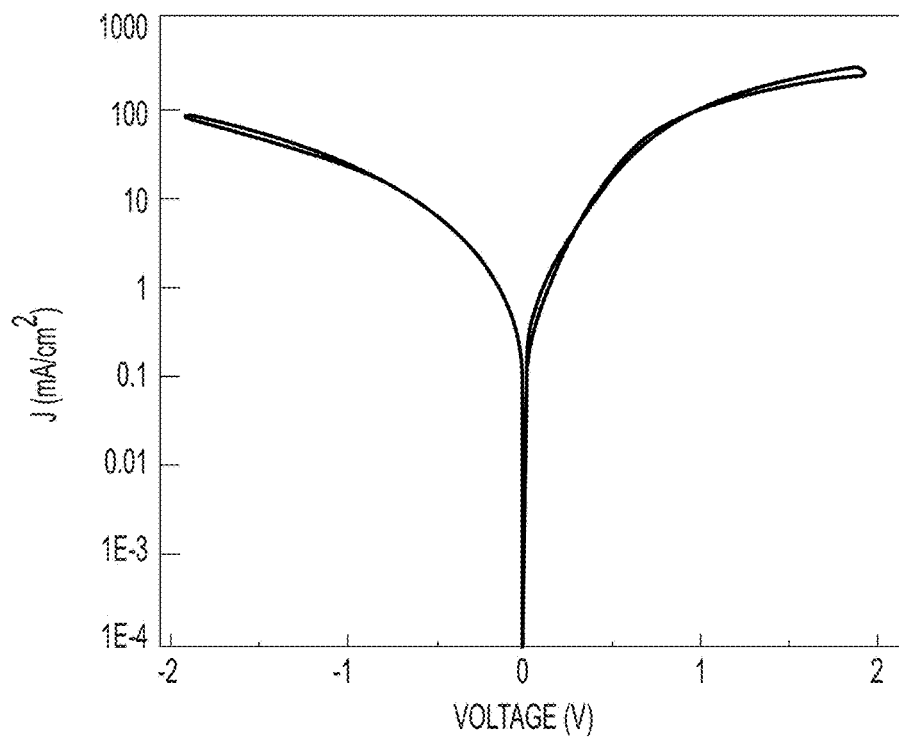
FIG. 10d shows a semi-logarithmic plot of the current density (mA/cm$^2$) as a function of voltage (V) for MWCNT-O-M as a function of temperature.

Arrays with qualitatively straighter and less entangled MWCNTs produced MWCNT-O-M (Al) diodes with better rectifying behavior (ratio of 60 at 3 V) and asymmetry than all other devices (FIG. 10a). However, tunnel currents are significantly lower in these devices because the diameter of MWCNTs is nearly twice as large, which likely reduces electric field enhancement at the tips. The reasons for the better rectification in the devices with straighter MWCNTs are not clear, but it highlights the potential significance of exercising greater control over array morphology. The J-V characteristics of several MWCNT-O-M devices were virtually unchanged from 5 to 77° C. (FIG. 10c), indicating that they do not behave as semiconductor based diodes or semiconducting CNT Schottky junctions, which have strong temperature dependence and are limited by their capacitance to operational frequencies below those that can be achieved by true quantum tunnel diodes.

Figure 11A:
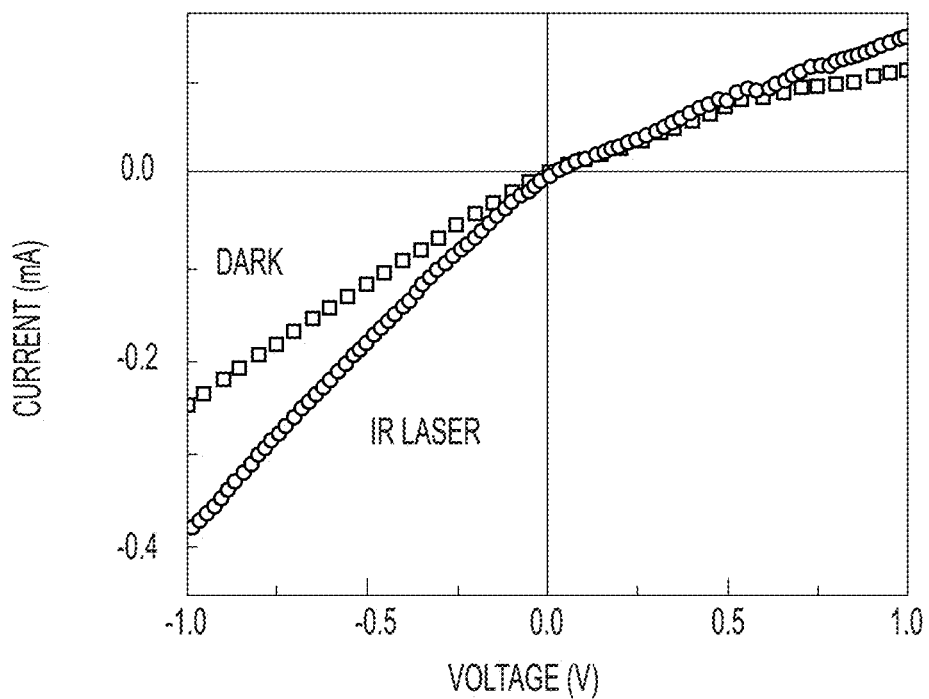
FIG. 11a is a graph showing the current-voltage characteristics of the MWCNT-O-M rectenna array in the dark and under illumination with 1064 nm laser.
Figure 11B:
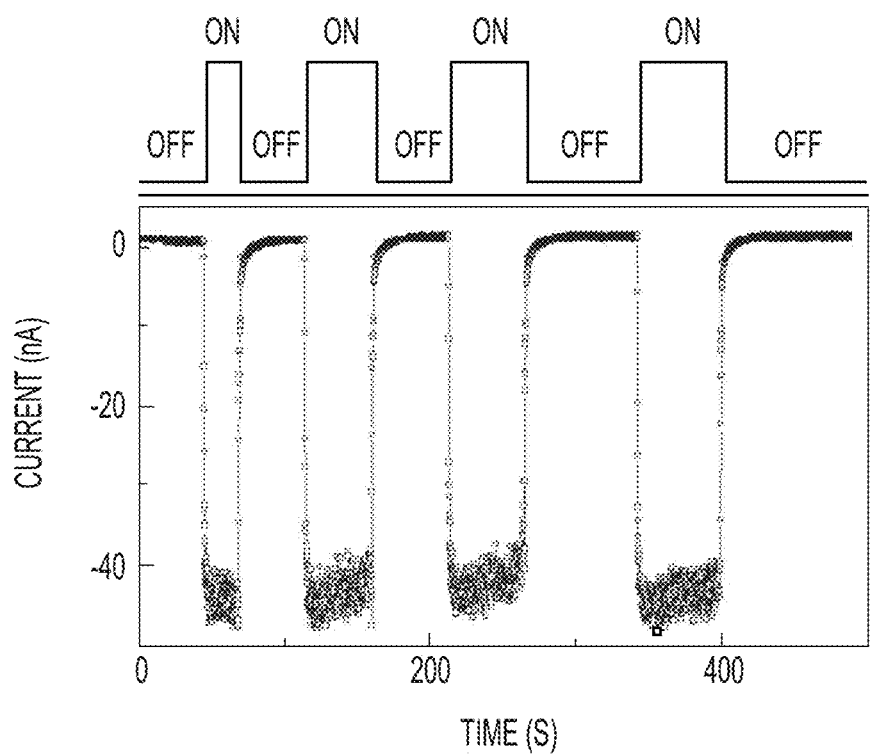
FIG. 11b is a graph showing the current as a function of time during switching on and off of the IR laser.
Figure 11C:
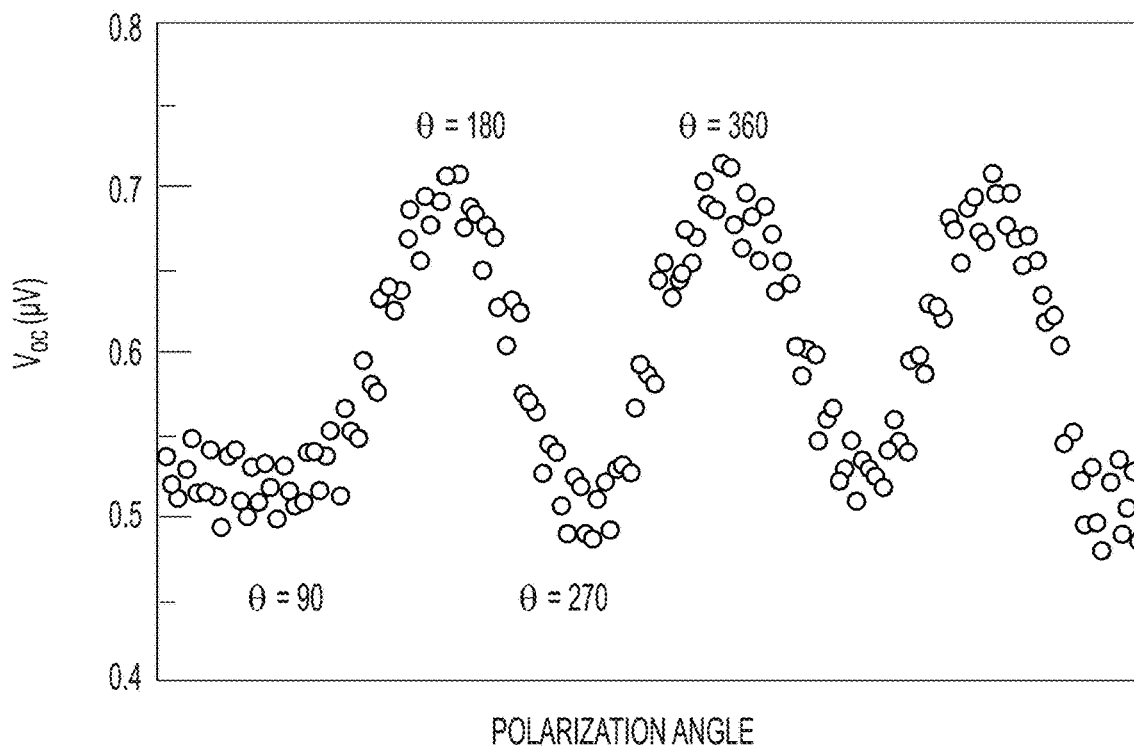
FIG. 11c is a graph showing the open circuit voltage as a function of the laser polarization angle.
Figure 12:
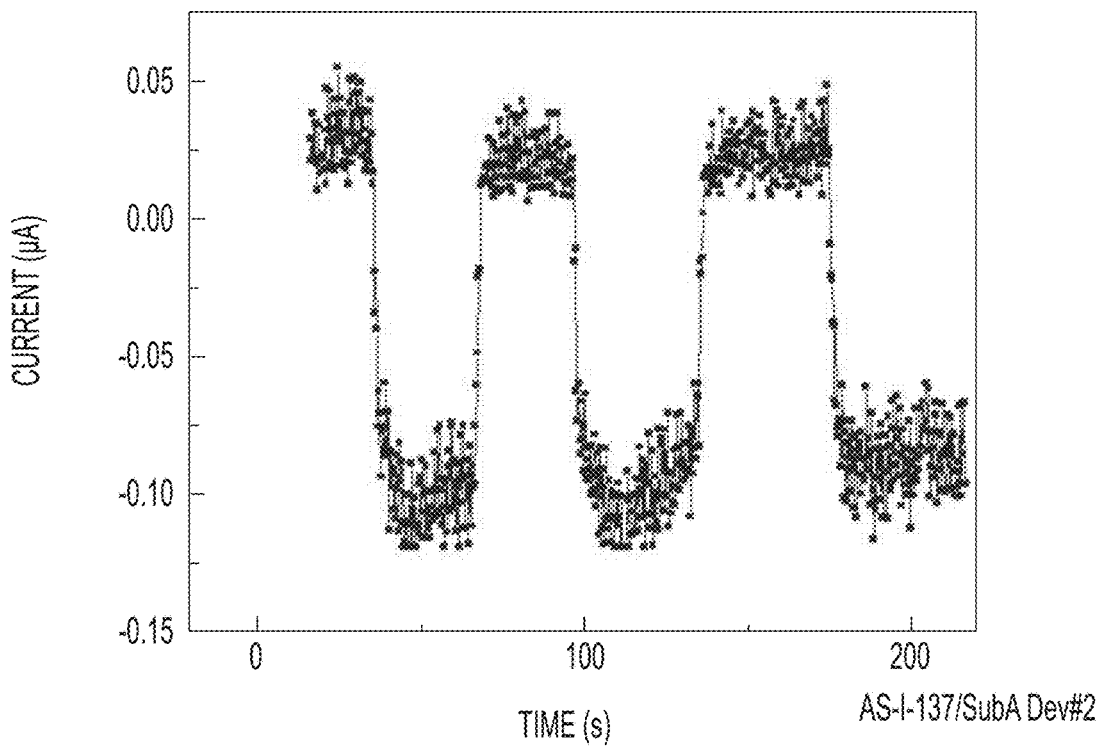
FIG. 12 is a graph showing the current-voltage characteristics of the MWCNT-O-M rectenna array in the dark and under illumination with 532 nm laser.
Figure 13A:
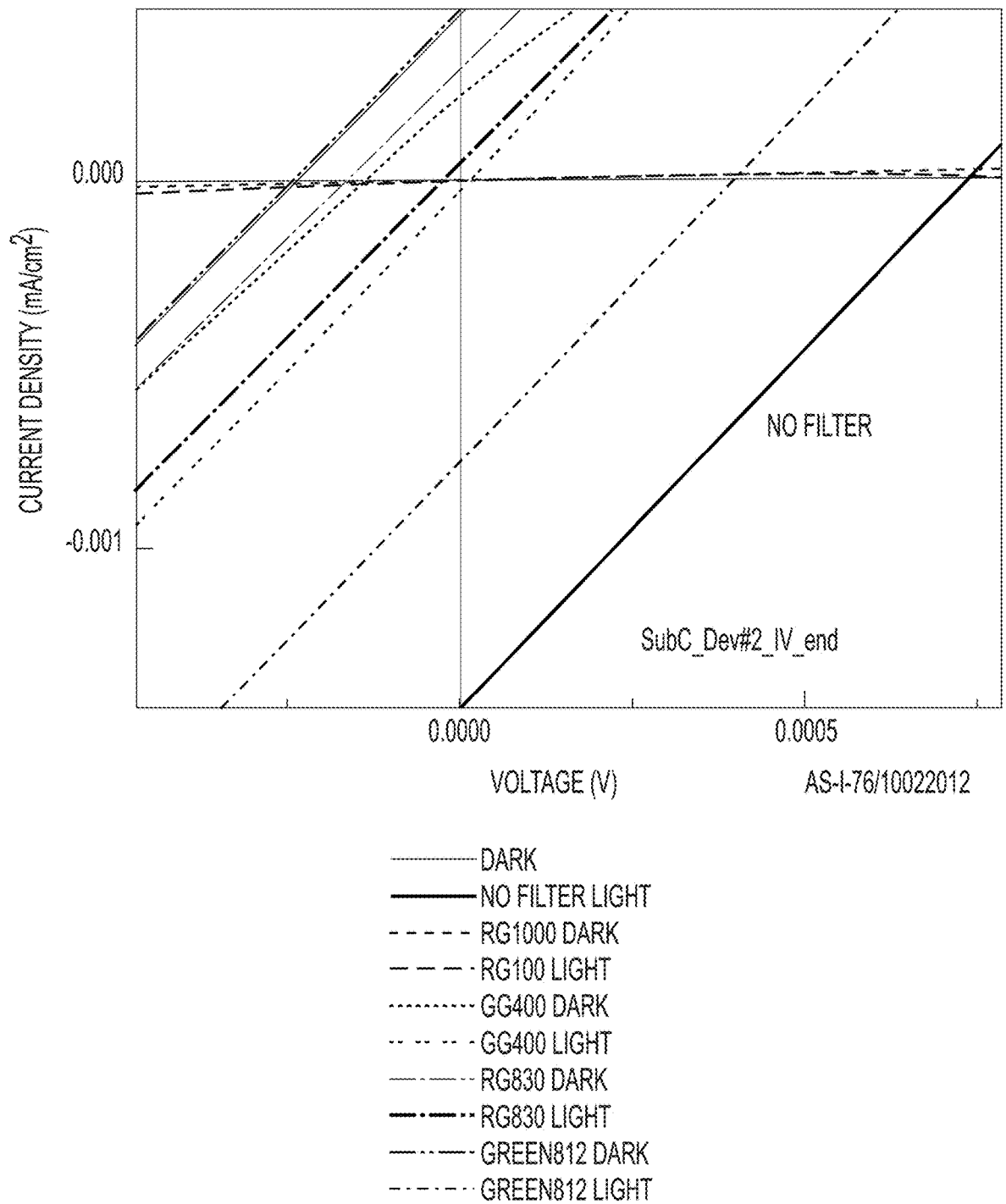
FIGS. 13A, 13B, and 13C are graphs showing the current-voltage characteristics of the MWCNT-O-M rectenna array when illuminated by AM1.5 0.01 W/cm$^2$ solar light and spectral filtered solar light response.
Figure 13B:
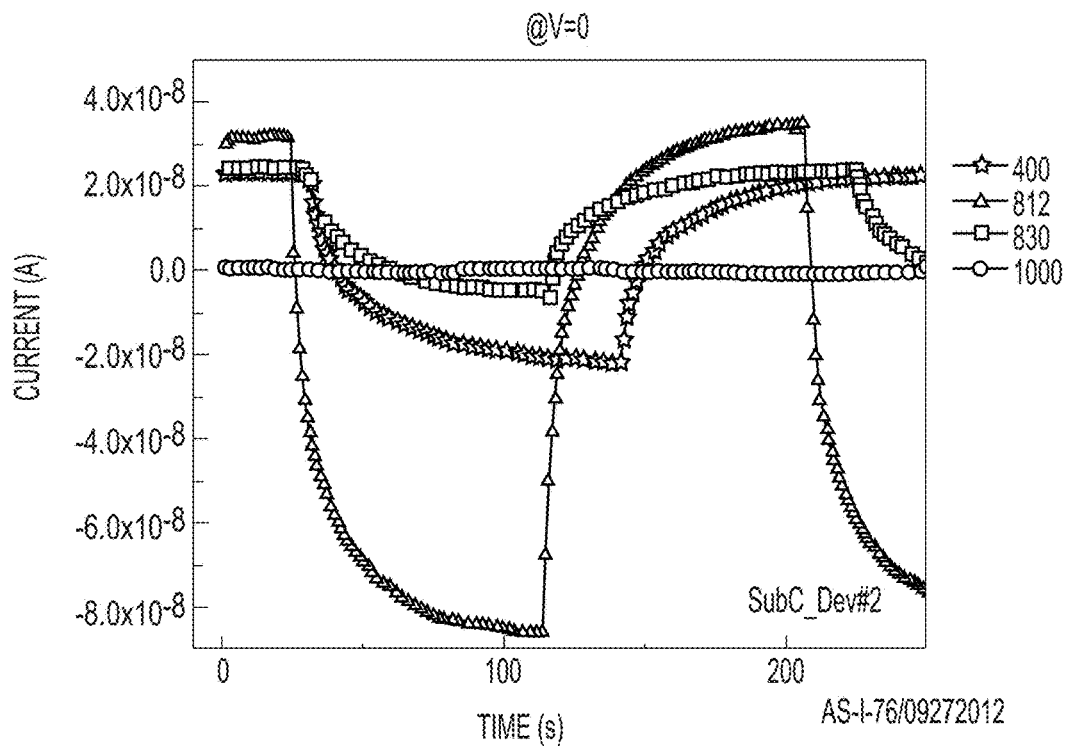
Figure 13C:
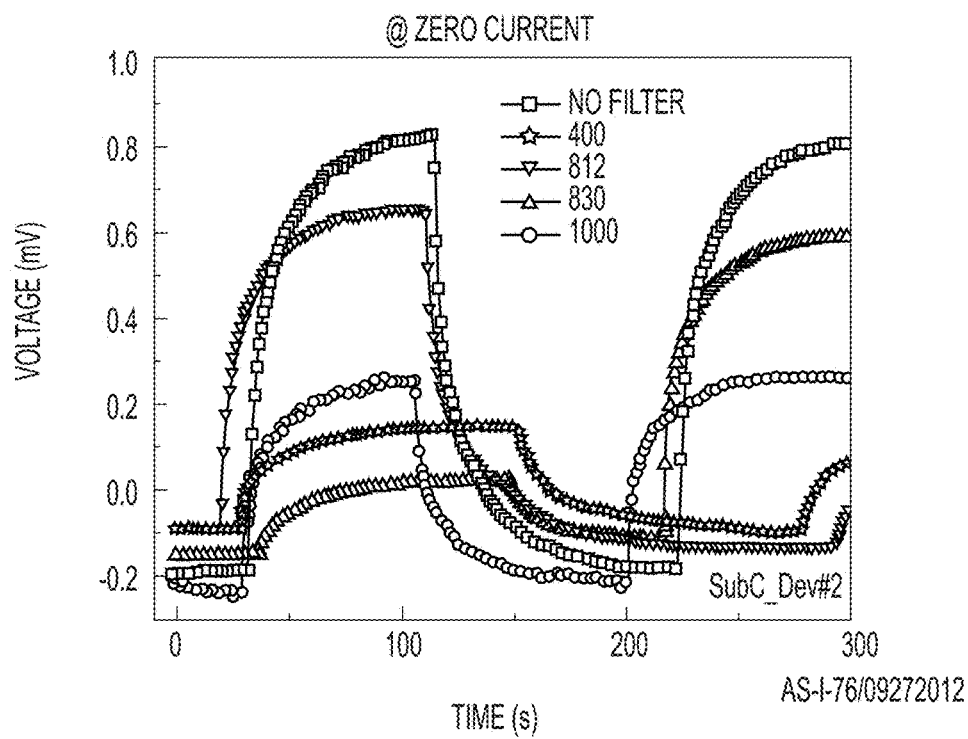

To demonstrate operation at ultrahigh frequency, rectenna devices were fabricated using the MWCNT-O-M vertical tunnel diode arrays and semitransparent top metal electrodes—20 nm Ca capped with 10 nm Al. Rectenna devices have yet to be demonstrated at solar frequencies because of limits on diode performance. It was observed that the diodes based on MWCNTs have the nanoscale dimensions and rectification performance required to overcome these limits. Current-voltage characteristics of the MWCNT-O-M rectenna array in dark, and under illumination with 1064 nm (~281 THz) laser are shown in FIG. 11a. The device was irradiated from the top at an angle of approximately 45 degrees with respect to the MWCNT alignment. This irradiation increased the nonlinearity of the MWCNT-O-M diode response. Switching the IR laser on and off produced a fast—instantaneous within the limits of our measurement sensitivity—current response at zero bias as shown in FIG. 11b. The open circuit voltage was measured as a function of the laser polarization angle and showed clear antenna effects on the rectified voltage (FIG. 11c). The data shows that the MWCNT-O-M diodes can operate at frequencies of at least 281 THz, which is well within the solar spectrum. Data for illumination at 532 nm is shown in FIG. 12. Data for illumination by AM1.5 0.01 W/cm² solar light for different devices in show in FIGS. 13a-13c. The arrays produce short circuit current densities greater than 0.1 μA/cm² or 1 μA/cm² when illuminated by laser wavelengths of 1064 nm or 532 nm, or when illuminated by AM1.5 0.01 W/cm² solar light.

We claim:

1. A method for converting solar energy to electrical energy, the method comprising receiving solar electromagnetic waves on a solar cell, the solar cell comprising a rectenna, the rectenna comprising an antenna coupled to a device comprising
    a substrate and a carbon nanostructure-oxide-metal vertical diode array,
    wherein the carbon nano structure-oxide-metal vertical diode array comprises a plurality of vertically aligned high aspect ratio porous carbon nanotubes having a packing density of between about $10^8$ and $10^{12}$ carbon nanotubes/cm²;
    wherein the plurality of vertically aligned high aspect ratio porous carbon nanotubes are uniformly and conformally coated with a dielectric layer and the dielectric layer extends down pores of the plurality of vertically aligned high aspect ratio porous carbon nanotubes and extends down a portion of the length of the plurality of vertically aligned high aspect ratio porous carbon nanotubes;
    wherein tips of the plurality of vertically aligned high aspect ratio porous carbon nanotubes are coated with a conducting material; and
    wherein a tunnel diode exists between the plurality of vertically aligned high aspect ratio porous carbon nanotubes, the dielectric layer, and the conducting material.

2. The method of claim 1, wherein the dielectric layer has a thickness of between about 0.5 nm to 15 nm.

3. The device of claim 2, wherein the thickness of the dielectric layer is between about 1 and 8 nm.

4. The device of claim 2, wherein the thickness of the dielectric layer is between about 1 and 5 nm.

5. The device of claim 2, wherein the thickness of the dielectric layer is between about 2 and 4 nm.

6. The device of claim 1, wherein the plurality of vertically aligned high aspect ratio carbon nanotubes have a packing density of about $10^{10}$ carbon nanotubes/cm².

7. The method of claim 1, wherein the substrate comprises one or more materials selected from the group consisting of silicon, indium tin oxide, fluorine doped tin oxide, glass, polymer, metal foils; or the substrate is coated with a thin metal layer to conduct electricity, or combinations thereof.

8. The method of claim 1, wherein the substrate comprises silicon.

9. The method of claim 1, wherein the dielectric layer is selected from the group consisting of $Al_2O_3$, $AlO_x$, $ZrO_2$, $TiO_2$, $ZnO$, $SiO_2$, $MgO$, $Nb_2O_5$, $CoO$, $NiO$, $Ta_2O_5$, $HfO_2$, polymeric dielectrics, organic surface modifiers/molecules, ionic liquids, and combinations thereof.

10. The method of claim 1, wherein the conducting material comprises
    (i) one or more low work functional metals selected from the group consisting of Al, Ca, Mg:Ag, LiF:Al, Ti, In, Ta, Hf, Zr, and combinations thereof; or
    (ii) one or more high work functional metals or materials selected from the group consisting of Pt, Au, W, Co, Ni, Pd, Ir, Os, and conducting polymers.

11. The method of claim 10, wherein
    (i) the one or more low work function metal is aluminum or calcium; or
    (ii) the one or more high work function metal is platinum or gold; or
    (iii) the one or more high work function material is the conducting polymer PEDOT:PSS.

12. The method of claim 1, wherein the plurality of vertically aligned high aspect ratio carbon nanotubes have an average length of between about 0.5 microns to about 50 microns.

13. The method of claim 12, wherein
    (i) the average length of the plurality of vertically aligned high aspect ratio porous carbon nanotubes is matched to a wavelength of electromagnetic energy of the solar electromagnetic waves that is coupled to the device; or
    (ii) the average length of the plurality of vertically aligned high aspect ratio porous carbon nanotubes is an integer multiple of the wavelength of the electromagnetic energy that is coupled to the device.

14. The method of claim 1, wherein each of the plurality of vertically aligned high aspect ratio porous carbon nanotubes have a diameter between about 5 and about 40 nm.

15. The method of claim 1, wherein each of the plurality of vertically aligned high aspect ratio porous carbon nanotubes have a diameter of between about 5 and about 20 nm.

16. The method of claim 1, wherein each of the plurality of vertically aligned high aspect ratio porous carbon nanotubes have a diameter of between about 5 and about 10 nm.

17. The method of claim 1, wherein
    (i) the device further comprises a support layer between the substrate and the plurality of vertically aligned high aspect ratio porous carbon nanotubes wherein the support layer comprises titanium, nickel, platinum, gold, or combinations thereof; or
    (ii) the device further comprises a catalyst layer between the substrate and the plurality of vertically aligned high aspect ratio porous carbon nanotubes, wherein the catalyst layer comprises aluminum, iron, nickel, cobalt, or combinations thereof.

* * * * *

UNITED STATES PATENT AND TRADEMARK OFFICE
CERTIFICATE OF CORRECTION

PATENT NO. : 10,985,313 B2
APPLICATION NO. : 16/738894
DATED : April 20, 2021
INVENTOR(S) : Cola et al.

Page 1 of 1

It is certified that error appears in the above-identified patent and that said Letters Patent is hereby corrected as shown below:

In the Claims

Claim 3, Column 17, Line 53, replace "The device" with --The method--.
Claim 4, Column 17, Line 55, replace "The device" with --The method--.
Claim 5, Column 17, Line 57, replace "The device" with --The method--.
Claim 6, Column 17, Line 59, replace "The device" with --The method--.

Signed and Sealed this
Seventh Day of December, 2021

Drew Hirshfeld
*Performing the Functions and Duties of the
Under Secretary of Commerce for Intellectual Property and
Director of the United States Patent and Trademark Office*